(12) United States Patent
Rajan

(10) Patent No.: US 7,379,316 B2
(45) Date of Patent: May 27, 2008

(54) METHODS AND APPARATUS OF STACKING DRAMS

(75) Inventor: Suresh N. Rajan, San Jose, CA (US)

(73) Assignee: MetaRAM, Inc., San Jose, CA (US)

( * ) Notice: Subject to any disclaimer, the term of this patent is extended or adjusted under 35 U.S.C. 154(b) by 0 days.

(21) Appl. No.: 11/515,406

(22) Filed: Sep. 1, 2006

(65) Prior Publication Data

US 2007/0058410 A1    Mar. 15, 2007

Related U.S. Application Data

(60) Provisional application No. 60/713,815, filed on Sep. 2, 2005.

(51) Int. Cl.
*G11C 5/06* (2006.01)
(52) U.S. Cl. ............... 365/63; 365/52; 365/233
(58) Field of Classification Search .......... 365/63, 365/230.03, 51, 233.1
See application file for complete search history.

(56) References Cited

U.S. PATENT DOCUMENTS

| | | | |
|---|---|---|---|
| 4,525,921 A | 7/1985 | Carson et al. ............... 29/577 |
| 4,646,128 A | 2/1987 | Carson et al. ............... 357/74 |
| 4,698,748 A | 10/1987 | Juzswik et al. ............ 364/200 |
| 4,706,166 A | 11/1987 | Go ........................... 361/403 |
| 4,710,903 A | 12/1987 | Hereth et al. .............. 365/194 |
| 4,764,846 A | 8/1988 | Go ........................... 361/388 |
| 4,780,843 A | 10/1988 | Tietjen ...................... 364/900 |
| 4,841,440 A | 6/1989 | Yonezu et al. ............. 364/200 |
| 4,884,237 A | 11/1989 | Mueller et al. ............... 365/63 |
| 4,982,265 A | 1/1991 | Watanabe et al. ........... 357/75 |
| 4,983,533 A | 1/1991 | Go .............................. 437/7 |
| 5,083,266 A | 1/1992 | Watanabe ................. 395/275 |
| 5,104,820 A | 4/1992 | Go et al. ..................... 437/51 |
| 5,220,672 A | 6/1993 | Nakao et al. .............. 395/750 |
| 5,347,428 A | 9/1994 | Carson et al. ............. 361/760 |
| 5,388,265 A | 2/1995 | Volk ......................... 395/750 |
| 5,432,729 A | 7/1995 | Carson et al. ............... 365/63 |
| 5,448,511 A | 9/1995 | Paurus et al. ................ 365/52 |
| 5,502,667 A | 3/1996 | Bertin et al. ................. 365/51 |
| 5,561,622 A | 10/1996 | Bertin et al. ................. 365/51 |
| 5,563,086 A | 10/1996 | Bertin et al. ................. 437/52 |
| 5,581,498 A | 12/1996 | Ludwig et al. .............. 365/63 |
| 5,590,071 A | 12/1996 | Kolor et al. ................ 365/149 |

(Continued)

FOREIGN PATENT DOCUMENTS

WO   PCT-US94-09186   8/1994

(Continued)

OTHER PUBLICATIONS

Written Opinion of the International Searching Authority for Related Foreign Application PCT/US2006/024360, mailed Jan. 8, 2007.

(Continued)

*Primary Examiner*—Huan Hoang
(74) *Attorney, Agent, or Firm*—Zilka-Kotab, PC

(57) ABSTRACT

Large capacity memory systems are constructed using stacked memory integrated circuits or chips. The stacked memory chips are constructed in such a way that eliminates problems such as signal integrity while still meeting current and future memory standards.

23 Claims, 15 Drawing Sheets

U.S. PATENT DOCUMENTS

| | | | |
|---|---|---|---|
| 5,608,262 A | 3/1997 | Degani et al. | 257/723 |
| 5,680,342 A | 10/1997 | Frankeny | 365/52 |
| 5,692,202 A | 11/1997 | Kardach et al. | 395/750 |
| 5,702,984 A | 12/1997 | Bertin et al. | 437/208 |
| 5,748,914 A | 5/1998 | Barth et al. | 395/285 |
| 5,752,045 A | 5/1998 | Chen | 395/750 |
| 5,835,435 A | 11/1998 | Bogin et al. | 365/227 |
| 5,838,165 A | 11/1998 | Chatter | |
| 5,843,807 A | 12/1998 | Burns | 438/109 |
| 5,845,108 A | 12/1998 | Yoo et al. | 395/551 |
| 5,860,106 A | 1/1999 | Domen et al. | 711/137 |
| 5,884,088 A | 3/1999 | Kardach et al. | 395/750 |
| 5,901,105 A | 5/1999 | Ong et al. | 365/230 |
| 5,905,688 A | 5/1999 | Park | 365/227 |
| 5,926,435 A | 7/1999 | Park et al. | 365/233 |
| 5,943,254 A | 8/1999 | Bakeman, Jr. et al. | 365/72 |
| 5,953,215 A | 9/1999 | Karabatsos | 361/767 |
| 5,956,233 A | 9/1999 | Yew et al. | 361/760 |
| 5,963,464 A | 10/1999 | Dell et al. | 365/52 |
| 5,973,392 A | 10/1999 | Senba et al. | 257/686 |
| 6,001,671 A | 12/1999 | Fjelstad | 438/112 |
| 6,014,339 A | 1/2000 | Kobayashi et al. | 365/233 |
| 6,038,673 A | 3/2000 | Benn et al. | 713/323 |
| 6,070,217 A | 5/2000 | Connolly et al. | 710/131 |
| 6,073,223 A | 6/2000 | McAllister et al. | 711/167 |
| 6,075,730 A | 6/2000 | Barth et al. | 365/191 |
| 6,079,025 A | 6/2000 | Fung | 713/323 |
| 6,088,290 A | 7/2000 | Ohtake et al. | 365/233 |
| RE36,839 E | 8/2000 | Simmons et al. | 326/93 |
| 6,154,370 A | 11/2000 | Degani et al. | 361/761 |
| 6,166,991 A | 12/2000 | Phelan | 365/233 |
| 6,222,739 B1 | 4/2001 | Bhakta et al. | 361/790 |
| 6,233,192 B1 | 5/2001 | Tanaka | 365/222 |
| 6,240,048 B1 | 5/2001 | Matsubara | 365/233 |
| 6,252,807 B1 | 6/2001 | Suzuki et al. | 365/193 |
| 6,298,426 B1 | 10/2001 | Ajanovic | 711/172 |
| 6,327,664 B1 | 12/2001 | Dell et al. | 713/323 |
| 6,338,108 B1 | 1/2002 | Motomura | |
| 6,338,113 B1 | 1/2002 | Kubo et al. | 711/105 |
| 6,353,561 B1 | 3/2002 | Funyu et al. | 365/195 |
| 6,356,500 B1 | 3/2002 | Cloud et al. | 365/226 |
| 6,363,031 B2 | 3/2002 | Phelan | 365/233 |
| 6,392,304 B1 | 5/2002 | Butler | 257/777 |
| 6,418,034 B1 | 7/2002 | Weber et al. | 361/790 |
| 6,430,103 B2 * | 8/2002 | Nakayama et al. | 365/230.03 |
| 6,442,698 B2 | 8/2002 | Nizar | 713/320 |
| 6,452,826 B1 | 9/2002 | Kim et al. | 365/51 |
| 6,453,400 B1 | 9/2002 | Maesako et al. | 711/167 |
| 6,457,095 B1 | 9/2002 | Volk | 711/105 |
| 6,487,102 B1 | 11/2002 | Halbert et al. | 365/51 |
| 6,489,669 B2 | 12/2002 | Shimada et al. | 257/686 |
| 6,496,440 B2 | 12/2002 | Manning | 365/230 |
| 6,510,097 B2 | 1/2003 | Fukuyama | |
| 6,521,984 B2 | 2/2003 | Matsuura | 257/768 |
| 6,526,471 B1 | 2/2003 | Shimomura et al. | 711/5 |
| 6,545,895 B1 | 4/2003 | Li et al. | 365/52 |
| 6,553,450 B1 | 4/2003 | Dodd et al. | 711/105 |
| 6,574,150 B2 | 6/2003 | Suyama et al. | 365/189 |
| 6,587,912 B2 | 7/2003 | Leddige et al. | 711/5 |
| 6,594,770 B1 | 7/2003 | Sato et al. | 713/320 |
| 6,597,617 B2 | 7/2003 | Ooishi et al. | 365/222 |
| 6,618,791 B1 | 9/2003 | Dodd et al. | 711/105 |
| 6,630,729 B2 | 10/2003 | Huang | 257/676 |
| 6,639,820 B1 | 10/2003 | Khandekar et al. | 365/63 |
| 6,646,939 B2 | 11/2003 | Kwak | 365/219 |
| 6,657,634 B1 | 12/2003 | Sinclair et al. | 345/534 |
| 6,658,530 B1 | 12/2003 | Robertson et al. | 711/115 |
| 6,665,227 B2 | 12/2003 | Fetzer | 365/229 |
| 6,683,372 B1 | 1/2004 | Wong et al. | 257/686 |
| 6,705,877 B1 | 3/2004 | Li et al. | 439/74 |
| 6,724,684 B2 | 4/2004 | Kim | 365/233 |
| 6,744,687 B2 | 6/2004 | Koo et al. | 365/226 |
| 6,747,887 B2 | 6/2004 | Halbert et al. | 365/51 |
| 6,751,113 B2 | 6/2004 | Bhakta et al. | 365/63 |
| 6,757,751 B1 | 6/2004 | Gene | 710/36 |
| 6,765,812 B2 | 7/2004 | Anderson | 365/51 |
| 6,771,526 B2 | 8/2004 | LaBerge | 365/63 |
| 6,772,359 B2 | 8/2004 | Kwak et al. | 713/500 |
| 6,799,241 B2 | 9/2004 | Kahn et al. | 711/105 |
| 6,816,991 B2 | 11/2004 | Sanghani | 714/733 |
| 6,820,163 B1 | 11/2004 | McCall et al. | 710/310 |
| 6,820,169 B2 | 11/2004 | Wilcox et al. | 711/105 |
| 6,845,055 B1 | 1/2005 | Koga et al. | 365/229 |
| 6,847,582 B2 | 1/2005 | Pan | 365/233 |
| 6,862,202 B2 | 3/2005 | Schaefer | 365/52 |
| 6,873,534 B2 | 3/2005 | Bhakta et al. | 365/63 |
| 6,878,570 B2 | 4/2005 | Lyu et al. | 438/106 |
| 6,894,933 B2 | 5/2005 | Kuzmenka et al. | 365/189 |
| 6,898,683 B2 | 5/2005 | Nakamura | 711/167 |
| 6,930,900 B2 | 8/2005 | Bhakta et al. | 365/51 |
| 6,930,903 B2 | 8/2005 | Bhakta et al. | 365/63 |
| 6,938,119 B2 | 8/2005 | Kohn et al. | 711/105 |
| 6,943,450 B2 | 9/2005 | Fee et al. | 257/773 |
| 6,951,982 B2 | 10/2005 | Chye et al. | 174/52 |
| 6,961,281 B2 | 11/2005 | Wong et al. | 365/230 |
| 6,968,416 B2 | 11/2005 | Moy | 710/310 |
| 6,968,419 B1 | 11/2005 | Holman | 711/5 |
| 6,970,968 B1 | 11/2005 | Holman | 711/5 |
| 6,986,118 B2 | 1/2006 | Dickman | 716/8 |
| 6,992,501 B2 | 1/2006 | Rapport | 326/30 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,175 B2 | 2/2006 | Chang et al. | 713/300 |
| 7,010,642 B2 | 3/2006 | Perego et al. | 711/5 |
| 7,026,708 B2 | 4/2006 | Caty et al. | 257/686 |
| 7,028,234 B2 | 4/2006 | Huckaby et al. | 714/710 |
| 7,033,861 B1 | 4/2006 | Partridge et al. | 438/109 |
| 7,035,150 B2 | 4/2006 | Streif et al. | 365/194 |
| 7,045,396 B2 | 5/2006 | Crowley et al. | 438/123 |
| 7,045,901 B2 | 5/2006 | Lin et al. | 257/778 |
| 7,046,538 B2 | 5/2006 | Kinsley et al. | 365/52 |
| 7,053,470 B1 | 5/2006 | Sellers et al. | 257/768 |
| 7,053,478 B2 | 5/2006 | Roper et al. | 257/686 |
| 7,061,784 B2 | 6/2006 | Jakobs et al. | 365/51 |
| 7,061,823 B2 | 6/2006 | Faue et al. | 365/230 |
| 7,066,741 B2 | 6/2006 | Burns et al. | 439/69 |
| 7,079,441 B1 | 7/2006 | Partsch et al. | 365/226 |
| 7,085,941 B2 | 8/2006 | Li | 713/300 |
| 7,089,438 B2 | 8/2006 | Raad | 713/322 |
| 7,103,730 B2 | 9/2006 | Saxena et al. | 711/156 |
| 2001/0000822 A1 | 5/2001 | Dell et al. | 711/170 |
| 2001/0021106 A1 | 9/2001 | Weber et al. | 361/790 |
| 2001/0021137 A1 | 9/2001 | Kai et al. | 365/222 |
| 2002/0019961 A1 | 2/2002 | Blodgett | 714/718 |
| 2002/0034068 A1 | 3/2002 | Weber et al. | 361/790 |
| 2002/0038405 A1 | 3/2002 | Leddige et al. | 711/115 |
| 2002/0041507 A1 | 4/2002 | Woo et al. | 365/51 |
| 2002/0064073 A1 | 5/2002 | Chien | 365/200 |
| 2002/0089831 A1 | 7/2002 | Forthun | 361/760 |
| 2002/0124195 A1 | 9/2002 | Nizar | 713/320 |
| 2002/0145900 A1 | 10/2002 | Schaefer | 365/52 |
| 2002/0174274 A1 | 11/2002 | Wu et al. | 710/100 |
| 2002/0184438 A1 | 12/2002 | Usui | 711/106 |
| 2003/0021175 A1 | 1/2003 | Tae Kwak | 365/219 |
| 2003/0035312 A1 | 2/2003 | Halbert et al. | 365/51 |
| 2003/0039158 A1 | 2/2003 | Horiguchi et al. | 365/200 |
| 2003/0061458 A1 | 3/2003 | Wilcox et al. | 711/167 |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0117875 A1 | 6/2003 | Lee et al. | 365/226 |
| 2003/0158995 A1 | 8/2003 | Lee et al. | 711/105 |
| 2003/0164539 A1 | 9/2003 | Yau | 257/686 |

| | | | | | | |
|---|---|---|---|---|---|---|
| 2003/0183934 A1 | 10/2003 | Barrett ........................ 257/738 | 2005/0193163 A1 | 9/2005 | Perego ........................ 711/105 |
| 2003/0189870 A1 | 10/2003 | Wilcox ........................ 365/233 | 2005/0207255 A1 | 9/2005 | Perego et al. ............... 365/222 |
| 2003/0191888 A1 | 10/2003 | Klein ........................ 711/105 | 2005/0210196 A1 | 9/2005 | Perego et al. ............... 711/115 |
| 2003/0191915 A1 | 10/2003 | Saxena et al. ............... 711/160 | 2005/0223179 A1 | 10/2005 | Perego et al. ............... 711/154 |
| 2003/0200474 A1 | 10/2003 | Li ........................ 713/320 | 2005/0224948 A1 | 10/2005 | Lee et al. .................... 257/686 |
| 2003/0205802 A1 | 11/2003 | Segaram ........................ 257/690 | 2005/0235131 A1 | 10/2005 | Ware ........................ 711/203 |
| 2003/0206476 A1 | 11/2003 | Joo ........................ 365/222 | 2005/0249011 A1 | 11/2005 | Maeda ........................ 365/222 |
| 2003/0217303 A1 | 11/2003 | Chua-Eoan et al. ........ 713/600 | 2005/0269715 A1 | 12/2005 | Yoo ........................ 257/780 |
| 2003/0227798 A1 | 12/2003 | Pax ........................ 365/189 | 2005/0278474 A1 | 12/2005 | Perersen et al. ............... 711/5 |
| 2003/0229821 A1 | 12/2003 | Ma ........................ 714/8 | 2005/0281123 A1 | 12/2005 | Bell et al. ........................ 365/230 |
| 2003/0231540 A1 | 12/2003 | Lazar et al. ............... 365/222 | 2005/0283572 A1 | 12/2005 | Ishihara ........................ 711/118 |
| 2003/0231542 A1 | 12/2003 | Zaharinova-Papazova et al. ........................ 365/226 | 2005/0289292 A1 | 12/2005 | Morrow et al. ............. 711/105 |
| | | | 2006/0010339 A1 | 1/2006 | Klein ........................ 714/5 |
| 2004/0027902 A1 | 2/2004 | Ooishi et al. ............... 365/222 | 2006/0039205 A1 | 2/2006 | Cornelius ........................ 365/189 |
| 2004/0034732 A1 | 2/2004 | Valin et al. ........................ 714/4 | 2006/0041711 A1 | 2/2006 | Miura et al. ............... 711/103 |
| 2004/0047228 A1 | 3/2004 | Chen ........................ 365/232 | 2006/0041730 A1 | 2/2006 | Larson ........................ 711/167 |
| 2004/0057317 A1 | 3/2004 | Schaefer ........................ 365/222 | 2006/0044913 A1 | 3/2006 | Klein et al. ............... 365/222 |
| 2004/0064767 A1 | 4/2004 | Huckaby et al. ............ 714/710 | 2006/0049502 A1 | 3/2006 | Goodwin et al. ........... 257/686 |
| 2004/0088475 A1 | 5/2004 | Streif et al. ............... 711/105 | 2006/0050574 A1 | 3/2006 | Streif et al. ............... 365/194 |
| 2004/0117723 A1 | 6/2004 | Foss ........................ 714/805 | 2006/0067141 A1 | 3/2006 | Perego et al. ............... 365/200 |
| 2004/0125635 A1 | 7/2004 | Kuzmenka ........................ 365/51 | 2006/0085616 A1 | 4/2006 | Zeighami et al. ........... 711/167 |
| 2004/0133736 A1 | 7/2004 | Kyung ........................ 711/105 | 2006/0090054 A1 | 4/2006 | Choi et al. .................... 711/167 |
| 2004/0139359 A1 | 7/2004 | Samson et al. ............. 713/320 | 2006/0112214 A1 | 5/2006 | Yeh ........................ 711/103 |
| 2004/0145963 A1 | 7/2004 | Byon ........................ 365/233 | 2006/0117160 A1 | 6/2006 | Jackson et al. ............. 711/170 |
| 2004/0151038 A1 | 8/2004 | Ruckerbauer et al. ...... 365/200 | 2006/0118933 A1 | 6/2006 | Haba ........................ 257/678 |
| 2004/0178824 A1 | 9/2004 | Pan ........................ 326/93 | 2006/0120193 A1 | 6/2006 | Casper ........................ 365/222 |
| 2004/0184324 A1 | 9/2004 | Pax ........................ 365/189 | 2006/0123265 A1 | 6/2006 | Ruckerbauer et al. ...... 713/500 |
| 2004/0186956 A1 | 9/2004 | Perego et al. ............... 711/115 | 2006/0126369 A1 | 6/2006 | Raghuram ........................ 365/51 |
| 2004/0188704 A1 | 9/2004 | Halbert et al. ............. 257/145 | 2006/0129712 A1 | 6/2006 | Raghuram ........................ 710/52 |
| 2004/0196732 A1 | 10/2004 | Lee ........................ 365/222 | 2006/0129755 A1 | 6/2006 | Raghuram ........................ 711/105 |
| 2004/0228166 A1 | 11/2004 | Braun et al. ............... 365/154 | 2006/0133173 A1 | 6/2006 | Jain et al. ........................ 365/222 |
| 2004/0228203 A1 | 11/2004 | Koo ........................ 365/233 | 2006/0176744 A1 | 8/2006 | Stave ........................ 365/194 |
| 2004/0230932 A1 | 11/2004 | Dickmann ........................ 716/10 | 2006/0179333 A1 | 8/2006 | Brittain et al. ............. 713/320 |
| 2004/0256638 A1 | 12/2004 | Perego et al. ............... 257/200 | 2006/0179334 A1 | 8/2006 | Brittain et al. ............. 713/320 |
| 2004/0257847 A1 | 12/2004 | Matsui et al. .................. 365/63 | 2006/0198178 A1 | 9/2006 | Kinsley et al. ............... 365/52 |
| 2004/0260957 A1 | 12/2004 | Jeddeloh et al. ............ 713/300 | 2006/0203590 A1 | 9/2006 | Mori et al. .................... 365/222 |
| 2005/0018495 A1 | 1/2005 | Bhakta et al. ............... 365/199 | 2006/0206738 A1 | 9/2006 | Jeddeloh et al. ............ 713/320 |
| 2005/0021874 A1 | 1/2005 | Georgiou et al. ........... 709/250 | 2006/0233012 A1 | 10/2006 | Sekiguchi et al. ............ 365/51 |
| 2005/0024963 A1 | 2/2005 | Jakobs et al. ............... 365/202 | 2006/0262586 A1 | 11/2006 | Solomon et al. ............... 365/63 |
| 2005/0036350 A1 | 2/2005 | So et al. ........................ 365/63 | 2007/0070669 A1 | 3/2007 | Tsern et al. |
| 2005/0041504 A1 | 2/2005 | Perego et al. ............... 365/222 | 2007/0088995 A1 | 4/2007 | Tsern et al. |
| 2005/0044303 A1 | 2/2005 | Perego et al. .................... 711/5 | | | |
| 2005/0044305 A1 | 2/2005 | Jakobs et al. ............... 711/105 | | | |
| 2005/0071543 A1 | 3/2005 | Ellis et al. ............... 711/106 | | | |
| 2005/0078532 A1 | 4/2005 | Ruckerbauer et al. ...... 365/199 | | | |
| 2005/0081085 A1 | 4/2005 | Ellis et al. ........................ 714/5 | | | |
| 2005/0099834 A1 | 5/2005 | Funaba et al. ................. 365/63 | | | |
| 2005/0102590 A1 | 5/2005 | Norris et al. ............... 714/719 | | | |
| 2005/0105318 A1 | 5/2005 | Funaba et al. ................. 365/63 | | | |
| 2005/0138267 A1 | 6/2005 | Bains et al. ............... 711/100 | | | |
| 2005/0139977 A1* | 6/2005 | Nishio et al. ............... 257/686 | | | |
| 2005/0149662 A1 | 7/2005 | Perego ........................ 711/5 | | | |
| 2005/0152212 A1 | 7/2005 | Yang et al. .................. 365/233 | | | |
| 2005/0156934 A1 | 7/2005 | Perego et al. ............... 345/531 | | | |
| 2005/0166026 A1 | 7/2005 | Ware et al. ................. 711/167 | | | |

FOREIGN PATENT DOCUMENTS

WO  WO 2007/038225 A2  4/2007

OTHER PUBLICATIONS

International Search Report for Related Foreign Application PCT/US2006/024360, mailed Jan. 8, 2007.
International Search Report for related foreign application PCT/US06/34390, mailed Nov. 21, 2007.
Written Opinion of the International Searching Authority for related foreign application PCT/US06/34390, mailed Nov. 21, 2007.

* cited by examiner

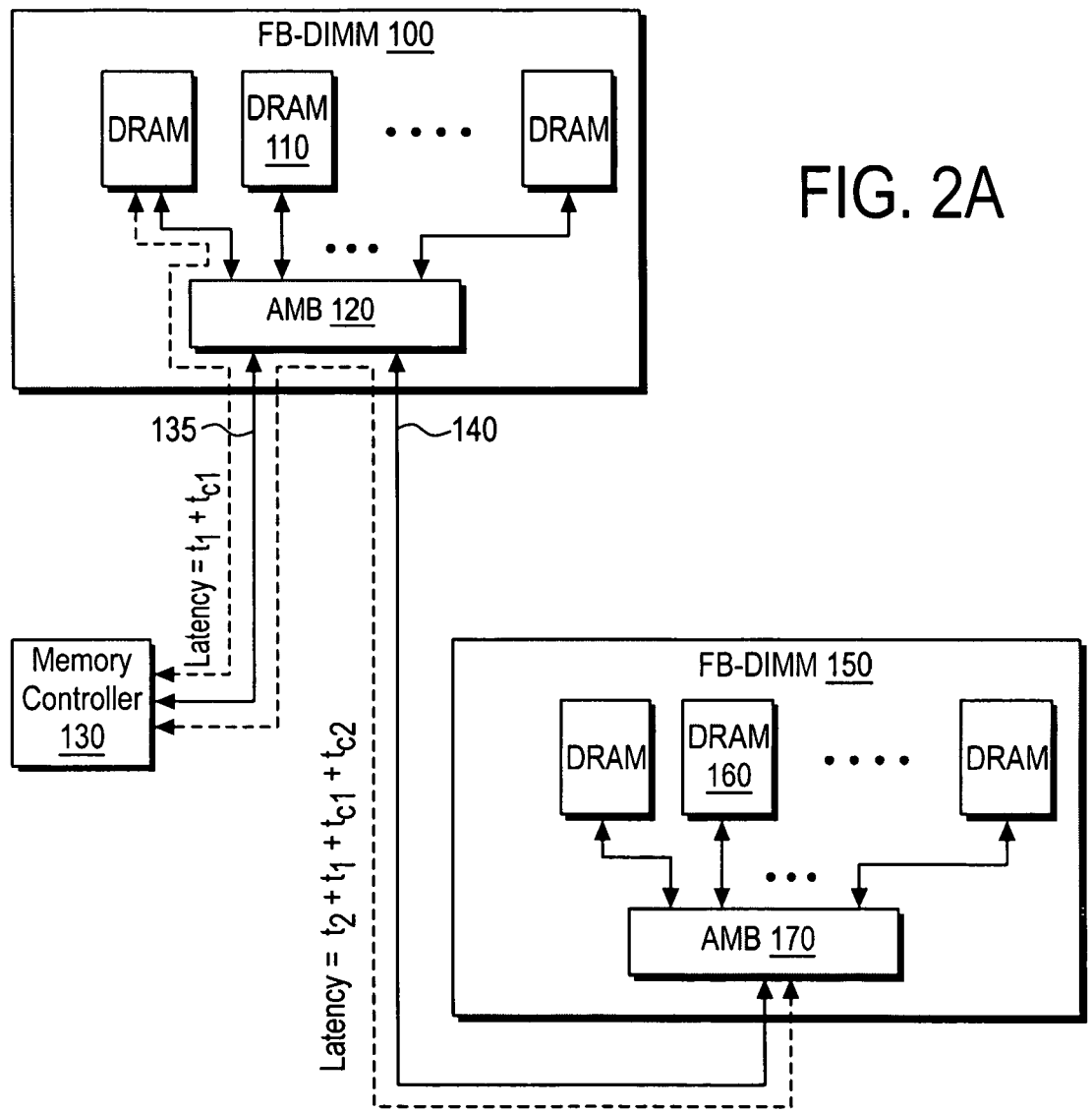

METHODS AND APPARATUS OF STACKING DRAMS

CROSS-REFERENCES TO RELATED APPLICATIONS

This patent application claims the benefit to U.S. Provisional Patent Application entitled "Methods and Apparatus of Stacking DRAMs," Ser. No. 60/713,815, filed on Sep. 2, 2005.

BACKGROUND OF THE INVENTION

1. Field of the Invention

The present invention is directed toward the field of building custom memory systems cost-effectively for a wide range of markets.

2. Art Background

Dynamic Random Access Memory (DRAM) is the most popular type of volatile memory and is widely used in a number of different markets. The popularity of DRAMs is mostly due to their cost-effectiveness (Mb/$). The PC main memory market has traditionally been the largest consumer of DRAMs.

The DRAM interface speed in several important markets is increasing rapidly. For example, the PC market today uses 667 MHz DDR2 SDRAMs. The industry is on track to use 800 MHz DDR2 SDRAMs in 2006. Effort is also underway in developing DDR3 SDRAMs that are expected to have interface speeds ranging from 800 MHz to 1600 MHz.

Signal integrity becomes increasingly challenging as the interface speed increases. At higher speeds, the number of loads on a memory channel must be decreased in order to ensure clean signals. For example, when the PC desktop segment used 133 MHz SDRAMs, three DIMM slots per memory channel (or bus or interface) was the norm when using unbuffered modules. When this market segment adopted DDR SDRAMs and now DDR2 SDRAMs, the number of DIMM slots per memory channel dropped to two. At DDR3 speeds, it is predicted that only one DEWM slot will be possible per memory channel. This obviously places an upper limit on the maximum memory capacity of the system.

Clearly there is a need for an invention that increases the memory capacity of a system in a manner that is both cost-effective and compatible with existing and future standards while solving various technical problems like signal integrity.

SUMMARY OF THE INVENTION

In one embodiment, large capacity memory systems are constructed using stacked memory integrated circuits or chips. The stacked memory chips are constructed in such a way that eliminates problems like signal integrity while still meeting current and future memory standards.

BRIEF DESCRIPTION OF THE DRAWINGS

FIG. 2A includes the FB-DIMMs of FIG. 1 with annotations to illustrate latencies between a memory controller and two FB-DIMMs.

DETAILED DESCRIPTION

The disclosure of U.S. Provisional Patent Application Ser. No. 60/713,815, entitled "Methods and Apparatus of Stacking DRAMs", filed on Sep. 2, 2005, is hereby expressly incorporated herein by reference.

Figure 1:
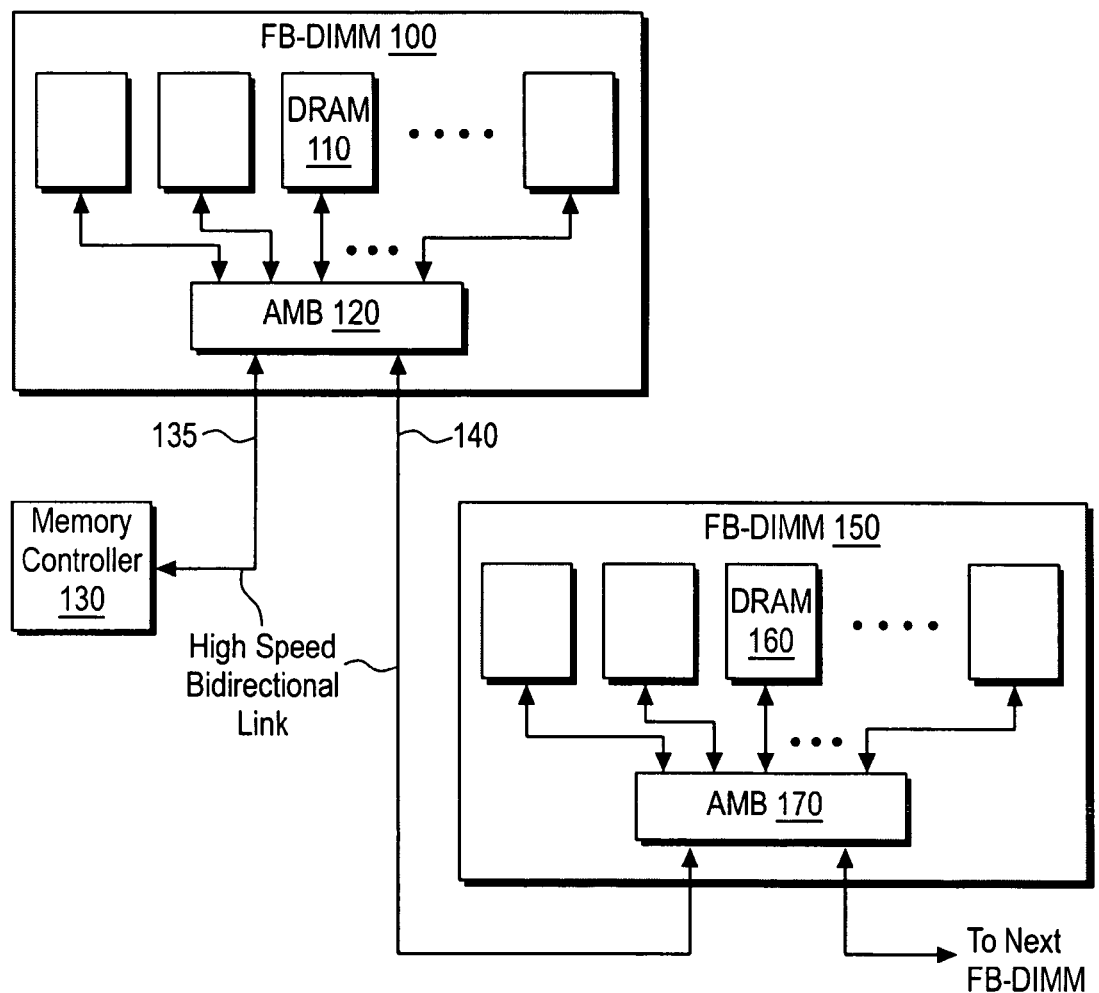
FIG. 1 illustrates one embodiment for a FB-DIMM.

There are market segments such as servers and workstations that require very large memory capacities. One way to provide large memory capacity is to use Fully Buffered DIMMs (FB-DIMMs), wherein the DRAMs are electrically isolated from the memory channel by an Advanced Memory Buffer (AMB). The FB-DIMM solution is expected to be used in the server and workstation market segments. An AMB acts as a bridge between the memory channel and the DRAMs, and also acts as a repeater. This ensures that the memory channel is always a point-to-point connection. FIG. 1 illustrates one embodiment of a memory channel with FB-DIMMs. FB-DIMMs 100 and 150 include DRAM chips (110 and 160) and AMBs 120 and 170. A high-speed bidirectional link 135 couples a memory controller 130 to FB-DIMM 100. Similarly, FB-DIMM 100 is coupled to FB-DIMM 150 via high-speed bidirectional link 140. Additional FB-DIMMs may be added in a similar manner.

The FB-DIMM solution has some drawbacks, the two main ones being higher cost and higher latency (i.e. lower performance). Each AMB is expected to cost $10-$15 in volume, a substantial additional fraction of the memory module cost. In addition, each AMB introduces a substantial amount of latency (~5 ns). Therefore, as the memory capacity of the system increases by adding more FB-DIMMs, the performance of the system degrades due to the latencies of successive AMBs.

An alternate method of increasing memory capacity is to stack DRAMs on top of each other. This increases the total memory capacity of the system without adding additional distributed loads (instead, the electrical load is added at almost a single point). In addition, stacking DRAMs on top of each other reduces the performance impact of AMBs since multiple FB-DIMMs may be replaced by a single FB-DIMM that contains stacked DRAMs. FIG. 2A includes the FB-DIMMs of FIG. 1 with annotations to illustrate latencies between a memory controller and two FB-DIMMs. The latency between memory controller 130 and FB-DIMM 100 is the sum of $t_1$ and $t_{c1}$, wherein $t_1$ is the delay between memory channel interface of the AMB 120 and the DRAM interface of AMB 120 (i.e., the delay through AMB 120 when acting as a bridge), and $t_{c1}$ is the signal propagation delay between memory controller 130 and FB-DIMM 100. Note that $t_1$ includes the delay of the address/control signals through AMB 120 and optionally that of the data signals through AMB 120. Also, $t_{c1}$ includes the propagation delay of signals from the memory controller 130 to FB-DIMM 100 and optionally, that of the signals from FB-DIMM 100 to the memory controller 130. As shown in FIG. 2A, the latency between memory controller 130 and FB-DIMM 150 is the sum of $t_2+t_1+t_{c1}+t_{c2}$, wherein $t_2$ is the delay between input and output memory channel interfaces of AMB 120 (i.e. when AMB 120 is operating as a repeater) and $t_{c2}$ is a signal propagation delay between FB-DIMM 100 and FB-DIMM 150. $t_2$ includes the delay of the signals from the memory controller 130 to FB-DIMM 150 through AMB 120, and optionally that of the signals from FB-DIMM 150 to memory controller 130 through AMB 120. Similarly, $t_{c2}$ represents the propagation delay of signals from FB-DIMM 100 to FB-DIMM 150 and optionally that of signals from FB-DIMM 150 and FB-DIMM 100. $t_1$ represents the delay of the signals through an AMB chip that is operating as a bridge, which in this instance, is AMB 170.

Figure 2B:
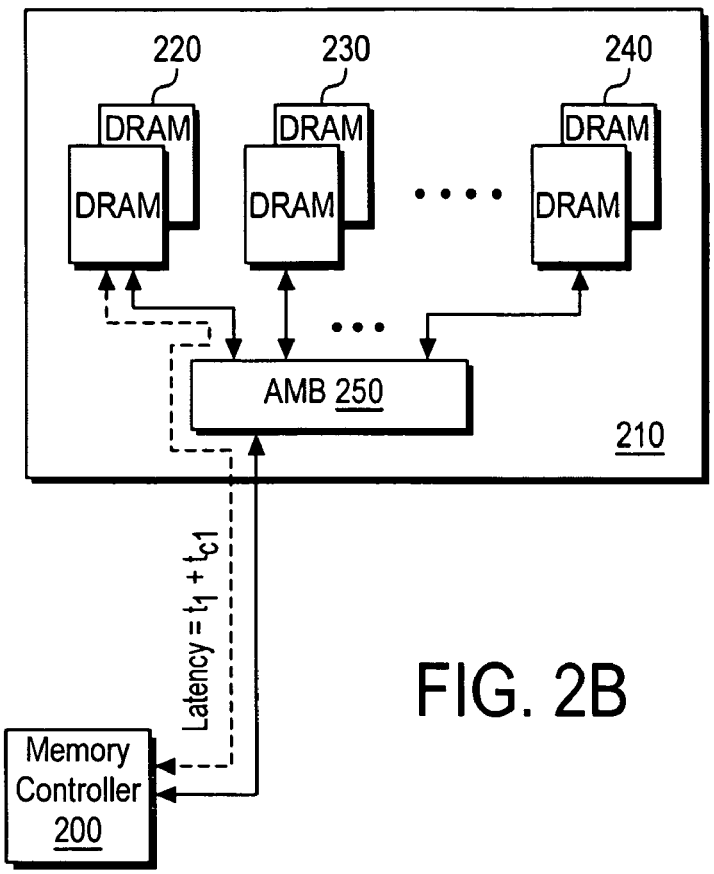
FIG. 2B illustrates latency in accessing an FB-DIMM with DRAM stacks, where each stack contains two DRAMs.

FIG. 2B illustrates latency in accessing an FB-DIMM with DRAM stacks, where each stack contains two DRAMs. In some embodiments, a "stack" comprises at least one DRAM chip. In other embodiments, a "stack" comprises an interface or buffer chip with at least one DRAM chip. FB-DIMM 210 includes three stacks of DRAMs (220, 230 and 240) and AMB 250 accessed by memory controller 200. As shown in FIG. 2B, the latency for accessing the stacks of DRAMs is the sum of $t_1$ and $t_{c1}$. It can be seen from FIG. 2A and 2B that the latency is less in a memory channel with an FB-DIMM that contains 2-DRAM stacks than in a memory channel with two standard FB-DIMMs (i.e. FB-DIMMs with individual DRAMs). Note that FIG. 2B shows the case of 2 standard FB-DIMMs vs. an FB-DIMM that uses 2-DRAM stacks as an example. However, this may be extended to n standard FB-DIMMs vs. an FB-DIMM that uses n-DRAM stacks.

Stacking high speed DRAMs on top of each other has its own challenges. As high speed DRAMs are stacked, their respective electrical loads or input parasitics (input capacitance, input inductance, etc.) add up, causing signal integrity and electrical loading problems and thus limiting the maximum interface speed at which a stack may operate. In addition, the use of source synchronous strobe signals introduces an added level of complexity when stacking high speed DRAMs.

Figure 3:
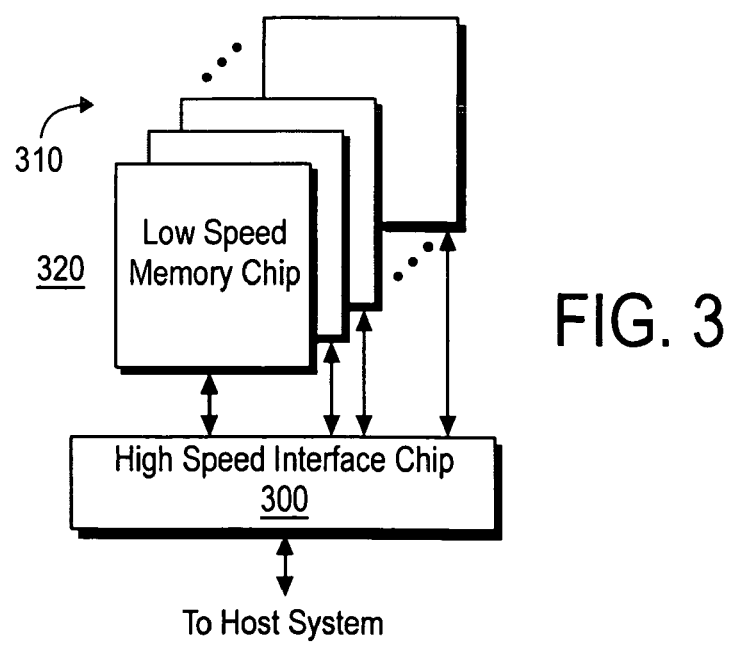
FIG. 3 is a block diagram illustrating one embodiment of a memory device that includes multiple memory core chips.
Figure 4:
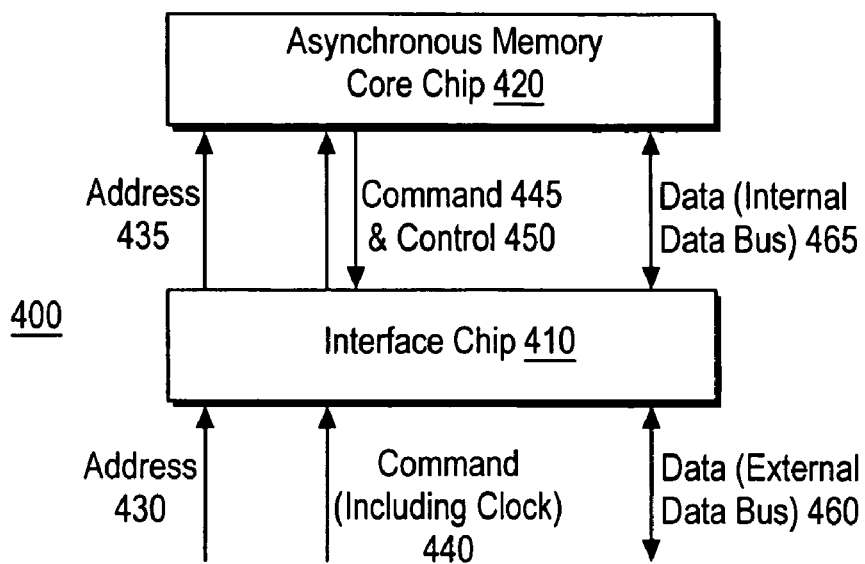
FIG. 4 is a block diagram illustrating one embodiment for partitioning a high speed DRAM device into asynchronous memory core chip and an interface chip.

Stacking low speed DRAMs on top of each other is easier than stacking high speed DRAMs on top of each other. Careful study of a high speed DRAM will show that it consists of a low speed memory core and a high speed interface. So, if we may separate a high speed DRAM into two chips—a low speed memory chip and a high speed interface chip, we may stack multiple low speed memory chips behind a single high speed interface chip. FIG. 3 is a block diagram illustrating one embodiment of a memory device that includes multiple memory core chips. Memory device 320 includes a high speed interface chip 300 and a plurality of low speed memory chips 310 stacked behind high speed interface chip 300. One way of partitioning is to separate a high speed DRAM into a low speed, wide, asynchronous memory core and a high speed interface chip. FIG. 4 is a block diagram illustrating one embodiment for partitioning a high speed DRAM device into asynchronous memory core and an interface chip. Memory device 400 includes asynchronous memory core chip 420 interfaced to a memory channel via interface chip 410. As shown in FIG. 4, interface chip 410 receives address (430), command (440) and data (460) from an external data bus, and uses address (435), command & control (445 and 450) and data (465) over an internal data bus to communicate with asynchronous memory core chip 420.

However, it must be noted that several other partitions are also possible. For example, the address bus of a high speed DRAM typically runs at a lower speed than the data bus. For a DDR400 DDR SDRAM, the address bus runs at a 200 MHz speed while the data bus runs at a 400 MHz speed, whereas for a DDR2-800 DDR2 SDRAM, the address bus runs at a 400 MHz speed while the data bus runs at an 800 MHz speed. High-speed DRAMs use pre-fetching in order to support high data rates. So, a DDR2-800 device runs internally at a rate equivalent to 200 MHz rate except that 4n data bits are accessed from the memory core for each read or write operation, where n is the width of the external data bus. The 4n internal data bits are multiplexed/de-multiplexed onto the n external data pins, which enables the external data pins to run at 4 times the internal data rate of 200 MHz.

Figure 5:
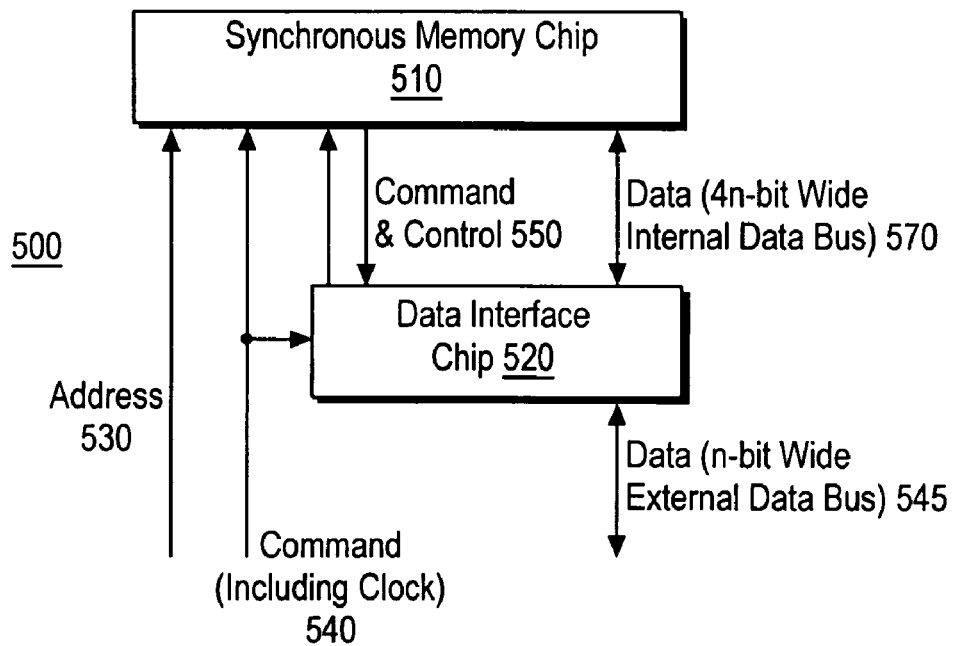
FIG. 5 is a block diagram illustrating one embodiment for partitioning a memory device into a synchronous memory chip and a data interface chip.

Thus another way to partition, for example, a high speed n-bit wide DDR2 SDRAM could be to split it into a slower, 4n-bit wide, synchronous DRAM chip and a high speed data interface chip that does the 4n to n data multiplexing/de-multiplexing. FIG. 5 is a block diagram illustrating one embodiment for partitioning a memory device into a synchronous memory chip and a data interface chip. For this embodiment, memory device 500 includes synchronous memory chip 510 and a data interface chip 520. Synchronous memory chip 510 receives address (530) and command & clock 540 from a memory channel. It also connected with data interface chip 520 through command & control (550) and data 570 over a 4n bit wide internal data bus. Data interface chip 520 connects to an n-bit wide external data bus 545 and a 4n-bit wide internal data bus 570. In one embodiment, an n-bit wide high speed DRAM may be partitioned into an m*n-bit wide synchronous DRAM chip and a high-speed data interface chip that does the m*n-to-n data multiplexing/de-multiplexing, where m is the amount of pre-fetching, m>1, and m is typically an even number.

As explained above, while several different partitions are possible, in some embodiments the partitioning should be done in such a way that:

the host system sees only a single load (per DIMM in the embodiments where the memory devices are on a DIMM) on the high speed signals or pins of the memory channel or bus and the memory chips that are to be stacked on top of each other operate at a speed lower than the data rate of the memory channel or bus (i.e. the rate of the external data bus), such that stacking these chips does not affect the signal integrity.

Based on this, multiple memory chips may be stacked behind a single interface chip that interfaces to some or all of the signals of the memory channel. Note that this means that some or all of the I/O signals of a memory chip connect to the interface chip rather than directly to the memory channel or bus of the host system. The I/O signals from the multiple memory chips may be bussed together to the interface chip or may be connected as individual signals to the interface chip. Similarly, the I/O signals from the multiple memory chips that are to be connected directly to the memory channel or bus of the host system may be bussed together or may be connected as individual signals to the external memory bus. One or more buses may be used when the I/O signals are to be bussed to either the interface chip or the memory channel or bus. Similarly, the power for the memory chips may be supplied by the interface chip or may come directly from the host system.

Figure 6:
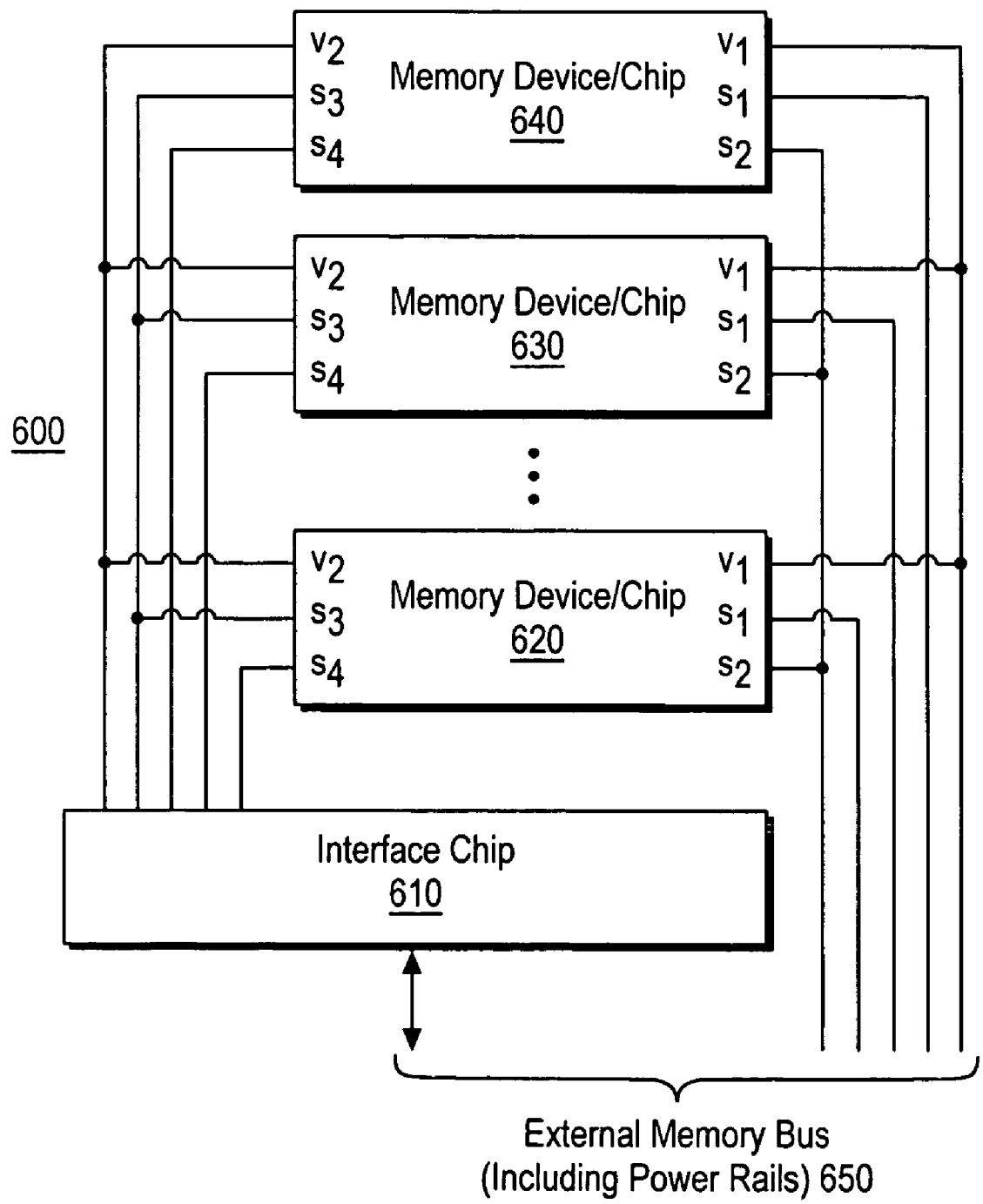
FIG. 6 illustrates one embodiment for stacked memory chips.

FIG. 6 illustrates one embodiment for stacked memory chips. Memory chips (620, 630 and 640) include inputs and/or outputs for $s_1$, $s_2$, $s_3$, $s_4$ as well as $v_1$ and $v_2$. The $s_1$ and $s_2$ inputs and/or outputs are coupled to external memory bus 650, and $s_3$ and $s_4$ inputs and/or outputs are coupled to interface chip 610. Memory signals $s_1$ and $s_4$ are examples of signals that are not bussed. Memory signals $s_2$ and $s_3$ are examples of bussed memory signals. Memory power rail $v_1$ is an example of memory power connected directly to external bus 650, whereas $v_2$ is an example of memory power rail connected to interface 610. The memory chips that are to be stacked on top of each other may be stacked as dies or as individually packaged parts. One method is to stack individually packaged parts since these parts may be tested and burnt-in before stacking. In addition, since packaged parts may be stacked on top of each other and soldered together, it is quite easy to repair a stack. To illustrate, if a part in the stack were to fail, the stack may be de-soldered and separated into individual packages, the failed chip may be replaced by a new and functional chip, and the stack may be re-assembled. However, it should be clear that repairing a stack as described above is time consuming and labor intensive.

One way to build an effective p-chip memory stack is to use p+q memory chips and an interface chip, where the q extra memory chips ($1 \leq q \leq p$, typically) are spare chips, wherein p and q comprise integer values. If one or more of the p memory chips becomes damaged during assembly of the stack, they may be replaced with the spare chips. The post-assembly detection of a failed chip may either be done using a tester or using built-in self test (BIST) logic in the interface chip. The interface chip may also be designed to have the ability to replace a failed chip with a spare chip such that the replacement is transparent to the host system.

This idea may be extended further to run-time (i.e. under normal operating conditions) replacement of memory chips in a stack. Electronic memory chips such as DRAMs are prone to hard and soft memory errors. A hard error is typically caused by broken or defective hardware such that the memory chip consistently returns incorrect results. For example, a cell in the memory array might be stuck low so that it always returns a value of "0" even when a "1" is stored in that cell. Hard errors are caused by silicon defects, bad solder joints, broken connector pins, etc. Hard errors may typically be screened by rigorous testing and burn-in of DRAM chips and memory modules. Soft errors are random, temporary errors that are caused when a disturbance near a memory cell alters the content of the cell. The disturbance is usually caused by cosmic particles impinging on the memory chips. Soft errors may be corrected by overwriting the bad content of the memory cell with the correct data. For DRAMs, soft errors are more prevalent than hard errors.

Computer manufacturers use many techniques to deal with soft errors. The simplest way is to use an error correcting code (ECC), where typically 72 bits are used to store 64 bits of data. This type of code allows the detection and correction of a single-bit error, and the detection of two-bit errors. ECC does not protect against a hard failure of a DRAM chip. Computer manufacturers use a technique called Chipkill or Advanced ECC to protect against this type of chip failure. Disk manufacturers use a technique called Redundant Array of Inexpensive Disks (RAID) to deal with similar disk errors.

More advanced techniques such as memory sparing, memory mirroring, and memory RAID are also available to protect against memory errors and provide higher levels of memory availability. These features are typically found on higher-end servers and require special logic in the memory controller. Memory sparing involves the use of a spare or redundant memory bank that replaces a memory bank that exhibits an unacceptable level of soft errors. A memory bank may be composed of a single DIMM or multiple DIMMs. Note that the memory bank in this discussion about advanced memory protection techniques should not be confused with the internal banks of DRAMs.

In memory mirroring, every block of data is written to system or working memory as well as to the same location in mirrored memory but data is read back only from working memory. If a bank in the working memory exhibits an unacceptable level of errors during read back, the working memory will be replaced by the mirrored memory.

RAID is a well-known set of techniques used by the disk industry to protect against disk errors. Similar RAID techniques may be applied to memory technology to protect against memory errors. Memory RAID is similar in concept to RAID 3 or RAID 4 used in disk technology. In memory RAID a block of data (typically some integer number of cachelines) is written to two or more memory banks while the parity for that block is stored in a dedicated parity bank. If any of the banks were to fail, the block of data may be re-created with the data from the remaining banks and the parity data.

These advanced techniques (memory sparing, memory mirroring, and memory RAID) have up to now been implemented using individual DIMMs or groups of DIMMs. This obviously requires dedicated logic in the memory controller. However, in this disclosure, such features may mostly be implemented within a memory stack and requiring only minimal or no additional support from the memory controller.

A DIMM or FB-DIMM may be built using memory stacks instead of individual DRAMs. For example, a standard FB-DIMM might contain nine, 18, or more DDR2 SDRAM chips. An FB-DIMM may contain nine 18, or more DDR2 stacks, wherein each stack contains a DDR2 SDRAM interface chip and one or more low speed memory chips stacked on top of it (i.e. electrically behind the interface chip—the interface chip is electrically between the memory chips and the external memory bus). Similarly, a standard DDR2 DIMM may contain nine 18 or more DDR2 SDRAM chips. A DDR2 DIMM may instead contain nine 18, or more DDR2 stacks, wherein each stack contains a DDR2 SDRAM interface chip and one or more low speed memory chips stacked on top of it. An example of a DDR2 stack built according to one embodiment is shown in FIG. 7.

Figure 7:
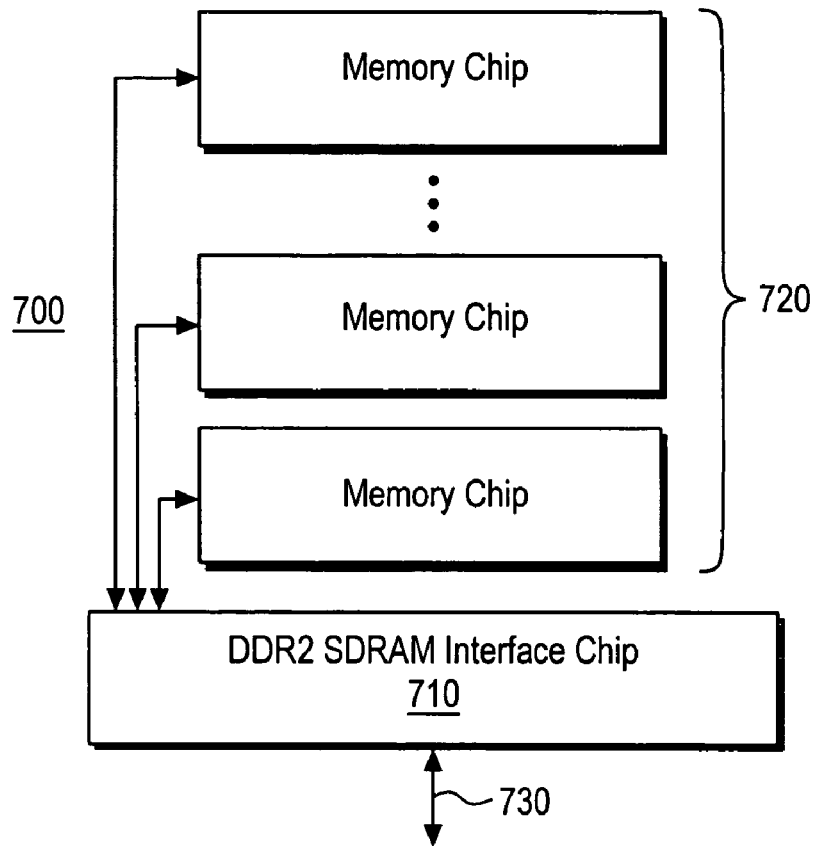
FIG. 7 is a block diagram illustrating one embodiment for interfacing a memory device to a DDR2 memory bus.

FIG. 7 is a block diagram illustrating one embodiment for interfacing a memory device to a DDR2 memory bus. As shown in FIG. 7, memory device 700 comprises memory chips 720 coupled to DDR2 SDRAM interface chip 710. In turn, DDR2 SDRAM interface chip 710 interfaces memory chips 720 to external DDR2 memory bus 730. As described previously, in one embodiment, an effective p-chip memory stack may be built with p+q memory chips and an interface chip, where the q chips may be used as spares, and p and q are integer values. In order to implement memory sparing within the stack, the p+q chips may be separated into two pools of chips: a working pool of p chips and a spare pool of q chips. So, if a chip in the working pool were to fail, it may be replaced by a chip from the spare pool. The replacement of a failed working chip by a spare chip may be triggered, for example, by the detection of a multi-bit failure in a working chip, or when the number of errors in the data read back from a working chip crosses a pre-defined or programmable error threshold.

Since ECC is typically implemented across the entire 64 data bits in the memory channel and optionally, across a plurality of memory channels, the detection of single-bit or multi-bit errors in the data read back is only done by the memory controller (or the AMB in the case of an FB-DIMM). The memory controller (or AMB) may be designed to keep a running count of errors in the data read back from each DIMM. If this running count of errors were to exceed a certain pre-defined or programmed threshold, then the memory controller may communicate to the interface chip to replace the chip in the working pool that is generating the errors with a chip from the spare pool.

For example, consider the case of a DDR2 DIMM. Let us assume that the DIMM contains nine DDR2 stacks (stack 0 through 8, where stack 0 corresponds to the least significant eight data bits of the 72-bit wide memory channel, and stack 8 corresponds to the most significant 8 data bits), and that each DDR2 stack consists of five chips, four of which are assigned to the working pool and the fifth chip is assigned to the spare pool. Let us also assume that the first chip in the working pool corresponds to address range [N−1:0], the second chip in the working pool corresponds to address range [2N−1:N], the third chip in the working pool corresponds to address range [3N−1:2N], and the fourth chip in the working pool corresponds to address range [4N−1:3N], where "N" is an integer value.

Under normal operating conditions, the memory controller may be designed to keep track of the errors in the data from the address ranges [4N−1:3N], [3N−1:2N], [2N−1:N], and [N−1:0]. If, say, the errors in the data in the address range [3N−1:2N] exceeded the pre-defined threshold, then the memory controller may instruct the interface chip in the stack to replace the third chip in the working pool with the spare chip in the stack. This replacement may either be done simultaneously in all the nine stacks in the DIMM or may be done on a per-stack basis. Assume that the errors in the data from the address range [3N−1:2N] are confined to data bits [7:0] from the DIMM. In the former case, the third chip in all the stacks will be replaced by the spare chip in the respective stacks. In the latter case, only the third chip in stack 0 (the LSB stack) will be replaced by the spare chip in that stack. The latter case is more flexible since it compensates for or tolerates one failing chip in each stack (which need not be the same chip in all the stacks), whereas the former case compensates for or tolerates one failing chip over all the stacks in the DIMM. So, in the latter case, for an effective p-chip stack built with p+q memory chips, up to q chips may fail per stack and be replaced with spare chips. The memory controller (or AMB) may trigger the memory sparing operation (i.e. replacing a failing working chip with a spare chip) by communicating with the interface chips either through in-band signaling or through sideband signaling. A System Management Bus (SMBus) is an example of sideband signaling.

Embodiments for memory sparing within a memory stack configured in accordance with some embodiments are shown in FIGS. 8*a*-8*e*.

Figure 8A:
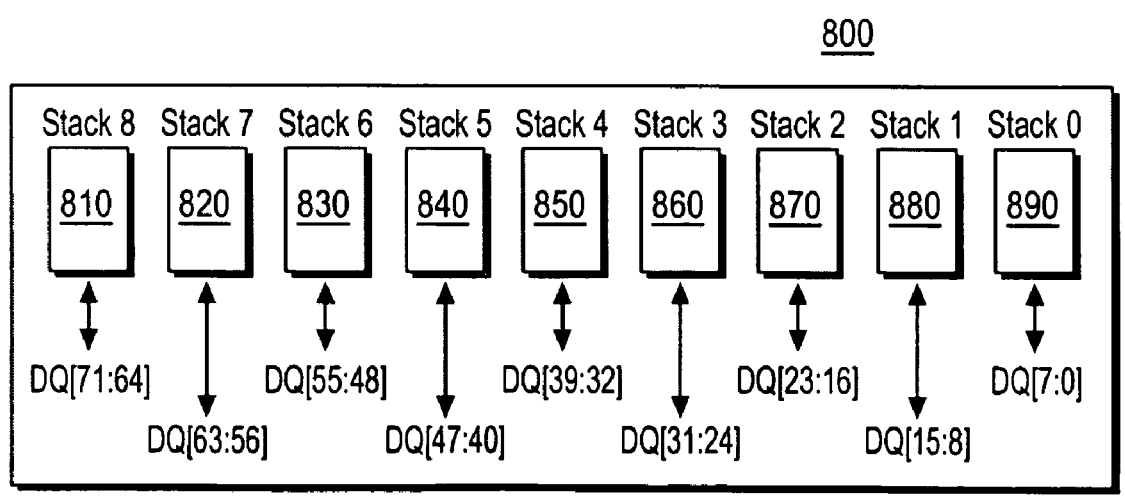
FIG. 8a is a block diagram illustrating one embodiment for stacking memory chips on a DIMM module.

FIG. 8*a* is a block diagram illustrating one embodiment for stacking memory chips on a DIMM module. For this example, memory module 800 includes nine stacks (810, 820, 830, 840, 850, 860, 870, 880 and 890). Each stack comprises at least two memory chips. In one embodiment, memory module 800 is configured to work in accordance with DDR2 specifications.

Figure 8B:
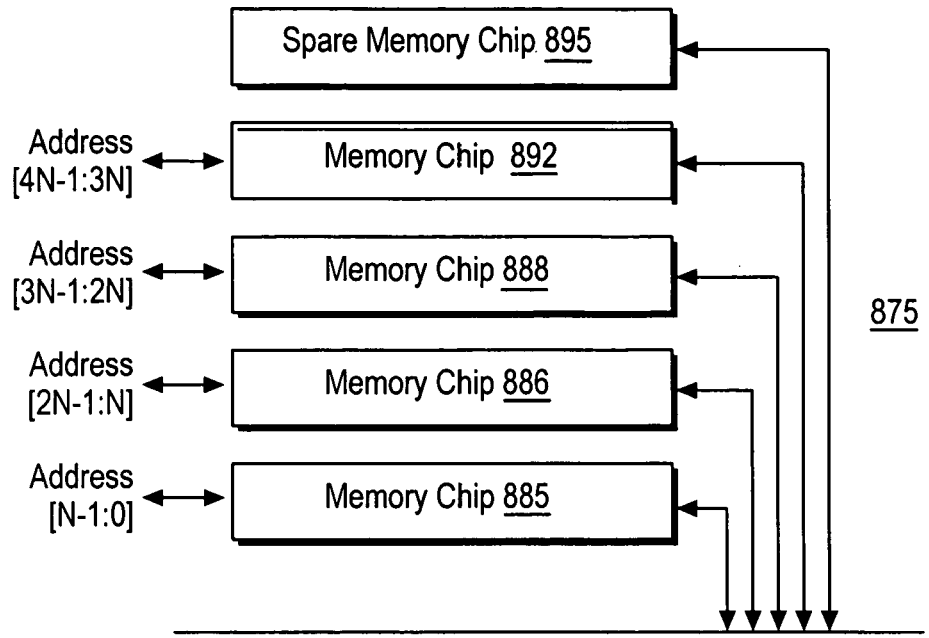
FIG. 8b is a block diagram illustrating one embodiment for stacking memory chips with memory sparing.

FIG. 8*b* is a block diagram illustrating one embodiment for stacking memory chips with memory sparing. For the example memory stack shown in FIG. 8*b*, memory device 875 includes memory chips (885, 886, 888 and 892) stacked to form the working memory pool. For this embodiment, to access the working memory pool, the memory chips are each assigned a range of addresses as shown in FIG. 8*b*. Memory device 875 also includes spare memory chip 895 that forms the spare memory pool. However, the spare memory pool may comprise any number of memory chips.

Figure 8C:
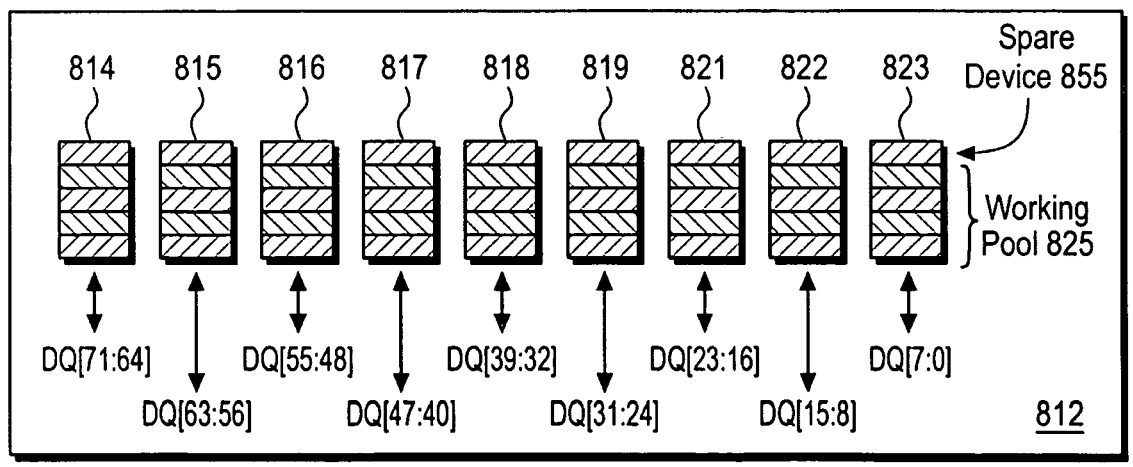
FIG. 8c is a block diagram illustrating operation of a working pool of stack memory.

FIG. 8*c* is a block diagram illustrating operation of a working memory pool. For this embodiment, memory module 812 includes a plurality of integrated circuit memory stacks (814, 815, 816, 817, 818, 819, 821, 822 and 823). For this example, each stack contains a working memory pool 825 and a spare memory chip 855.

Figure 8D:
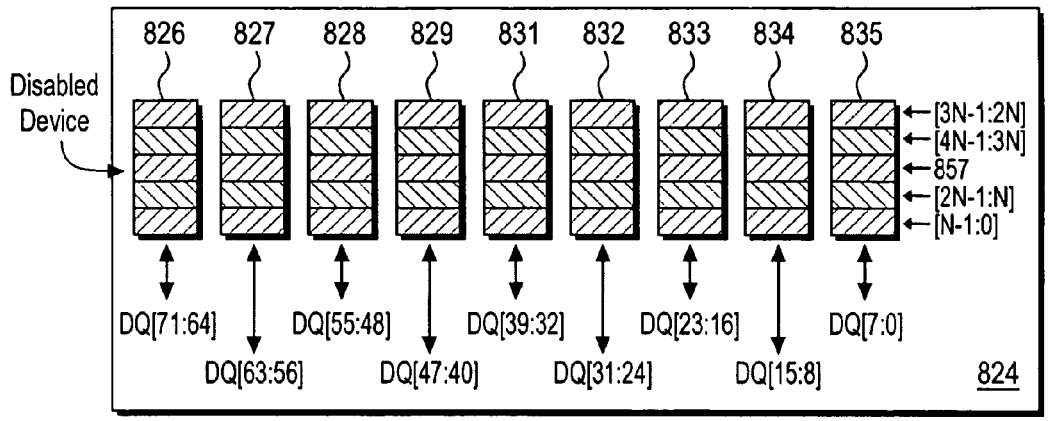
FIG. 8d is a block diagram illustrating one embodiment for implementing memory sparing for stacked memory chips.

FIG. 8*d* is a block diagram illustrating one embodiment for implementing memory sparing for stacked memory chips. For this example, memory module 824 also includes a plurality of integrated circuit memory stacks (826, 827, 828, 829, 831, 832, 833, 834 and 835). For this embodiment, memory sparing may be enabled if data errors occur in one or more memory chips (i.e., occur in an address range). For the example illustrated in FIG. 8*d*, data errors exceeding a predetermined threshold have occurred in DQ[7:0] in the address range [3N−1:2N]. To implement memory sparing, the failing chip is replaced simultaneously in all of the stacks of the DIMM. Specifically, for this example, failing chip 857 is replaced by spare chip 855 in all memory stacks of the DIMM.

Figure 8E:
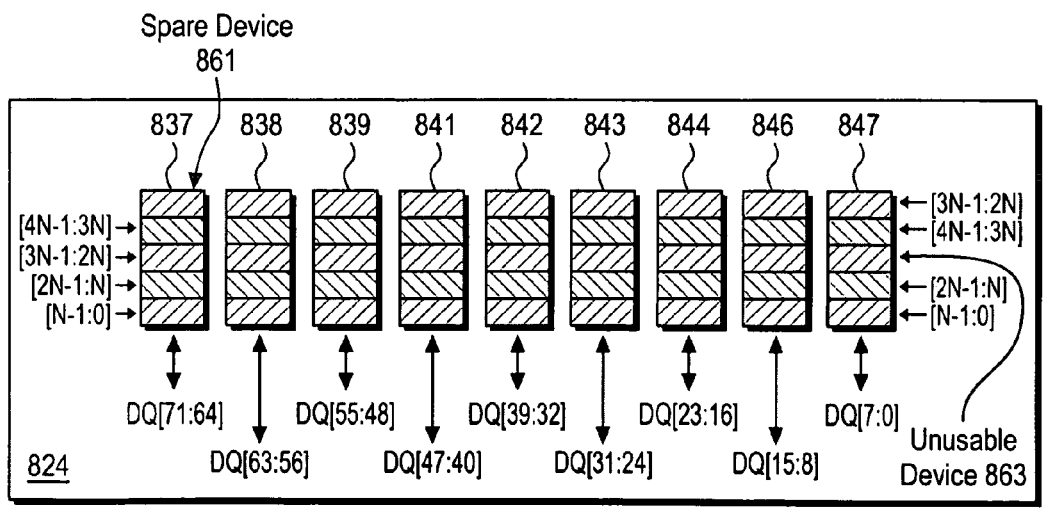
FIG. 8e is a block diagram illustrating one embodiment for implementing memory sparing on a per stack basis.

FIG. 8e is a block diagram illustrating one embodiment for implementing memory sparing on a per stack basis. For this embodiment, memory module 836 also includes a plurality of integrated circuit memory stacks (837, 838, 839, 841, 842, 843, 844, 846 and 847). Each stack is apportioned into the working memory pool and a spare memory pool (e.g., spare chip 861). For this example, memory chip 863 failed in stack 847. To enable memory sparing, only the spare chip in stack 847 replaces the failing chip, and all other stacks continue to operate using the working pool.

Memory mirroring can be implemented by dividing the p+q chips in each stack into two equally sized sections—the working section and the mirrored section. Each data that is written to memory by the memory controller is stored in the same location in the working section and in the mirrored section. When data is read from the memory by the memory controller, the interface chip reads only the appropriate location in the working section and returns the data to the memory controller. If the memory controller detects that the data returned had a multi-bit error, for example, or if the cumulative errors in the read data exceeded a pre-defined or programmed threshold, the memory controller can be designed to tell the interface chip (by means of in-band or sideband signaling) to stop using the working section and instead treat the mirrored section as the working section. As discussed for the case of memory sparing, this replacement can either be done across all the stacks in the DIMM or can be done on a per-stack basis. The latter case is more flexible since it can compensate for or tolerate one failing chip in each stack whereas the former case can compensate for or tolerate one failing chip over all the stacks in the DIMM.

Embodiments for memory mirroring within a memory stack are shown in FIGS. 9a-9e.

Figure 9A:
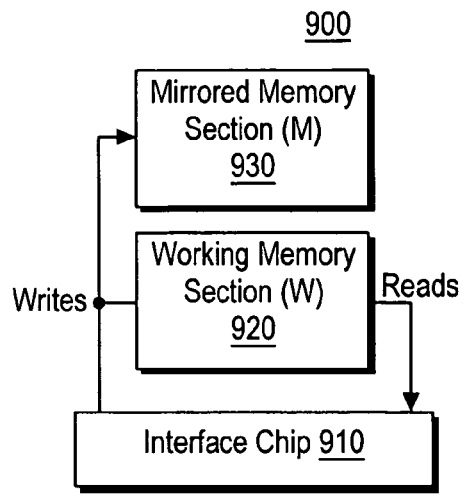
FIG. 9a is a block diagram illustrating memory mirroring in accordance with one embodiment.

FIG. 9a is a block diagram illustrating memory mirroring in accordance with one embodiment. As shown in FIG. 9a, a memory device 900 includes interface chip 910 that interfaces memory to an external memory bus. The memory is apportioned into a working memory section 920 and a mirrored memory section 930. During normal operation, write operations occur in both the working memory section 920 and the mirrored memory section 930. However, read operations are only conducted from the working memory section 920.

Figure 9B:
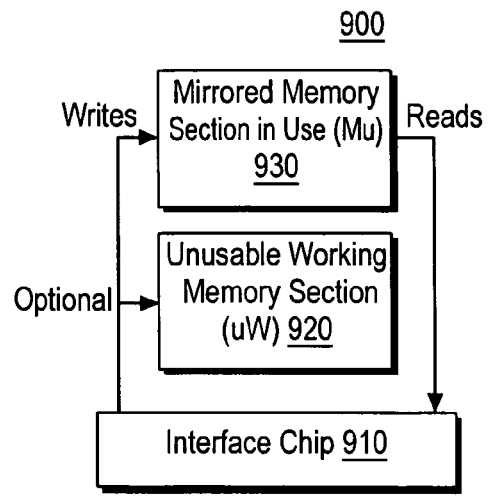
FIG. 9b is a block diagram illustrating one embodiment for a memory device that enables memory mirroring.

FIG. 9b is a block diagram illustrating one embodiment for a memory device that enables memory mirroring. For this example, memory device 900 uses mirrored memory section 930 as working memory due to a threshold of errors that occurred in the working memory 920. As such, working memory section 920 is labeled as the unusable working memory section. In operation, interface chip 910 executes write operations to mirrored memory section 930 and optionally to the unusable working memory section 920. However, with memory mirroring enabled, reads occur from mirrored memory section 930.

Figure 9C:
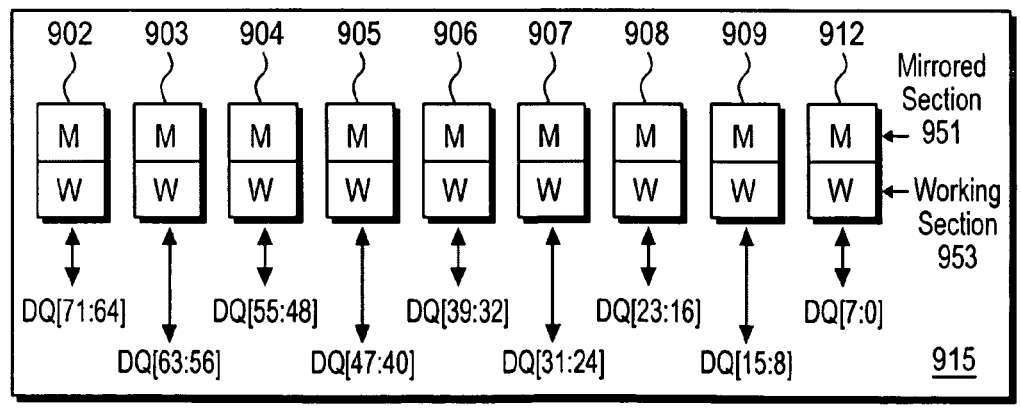
FIG. 9c is a block diagram illustrating one embodiment for a mirrored memory system with stacks of memory.

FIG. 9c is a block diagram illustrating one embodiment for a mirrored memory system with integrated circuit memory stacks. For this embodiment, memory module 915 includes a plurality of integrated circuit memory stacks (902, 903, 904, 905, 906, 907, 908, 909 and 912). As shown in FIG. 9c, each stack is apportioned into a working memory section 953, and labeled "W" in FIG. 9c, as well as a mirrored memory section 951, labeled "M" in FIG. 9c. For this example, the working memory section is accessed (i.e., mirrored memory is not enabled).

Figure 9D:
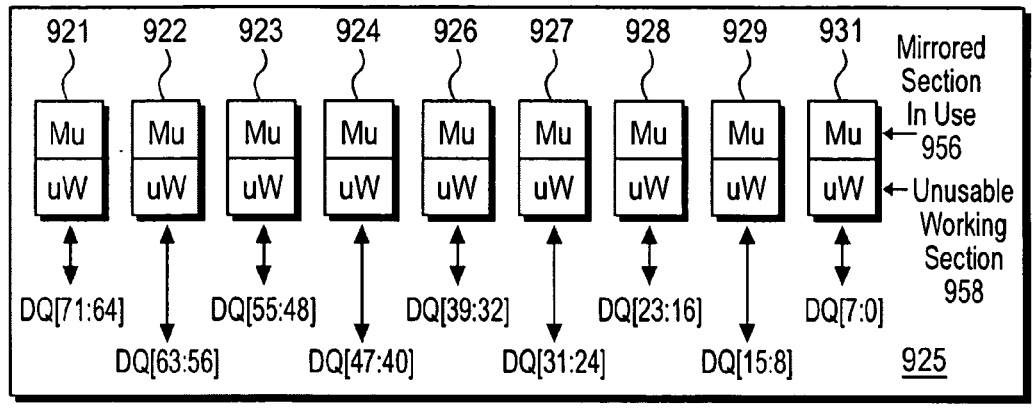
FIG. 9d is a block diagram illustrating one embodiment for enabling memory mirroring simultaneously across all stacks of a DIMM.

FIG. 9d is a block diagram illustrating one embodiment for enabling memory mirroring simultaneously across all stacks of a DIMM. For this embodiment, memory module 925 also includes a plurality of integrated circuit memory stacks (921, 922, 923, 924, 926, 927, 928, 929 and 931) apportioned into a mirrored memory section 956 and a working memory section 958. For this embodiment, when memory mirroring is enabled, all chips in the mirrored memory section for each stack in the DIMM are used as the working memory.

Figure 9E:
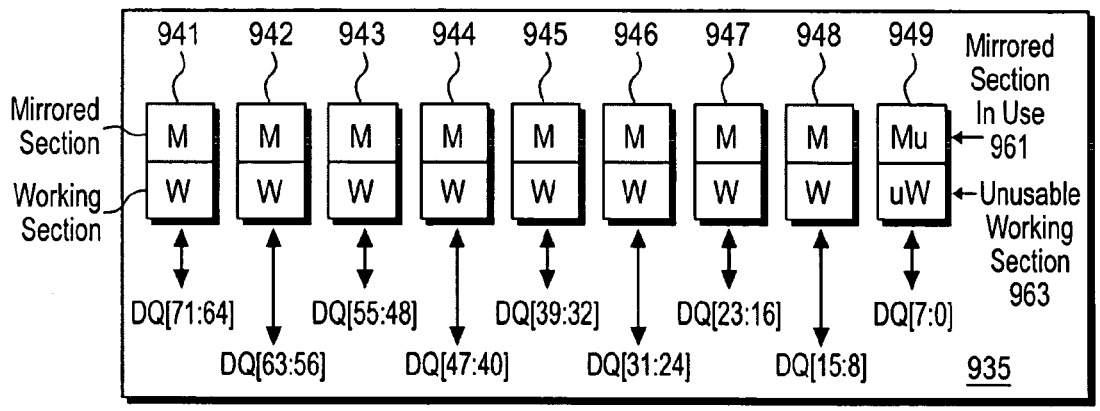
FIG. 9e is a block diagram illustrating one embodiment for enabling memory mirroring on a per stack basis.

FIG. 9e is a block diagram illustrating one embodiment for enabling memory mirroring on a per stack basis. For this embodiment, memory module 935 includes a plurality of integrated circuit memory stacks (941, 942, 943, 944, 945, 946, 947, 948 and 949) apportioned into a mirrored section 961 (labeled "M") and a working memory section 963 (labeled "W"). For this embodiment, when a predetermined threshold of errors occurs from a portion of the working memory, mirrored memory from the corresponding stack is replaced with working memory. For example, if data errors occurred in DQ[7:0] and exceed a threshold, then mirrored memory section 961 (labeled "Mu") replaces working memory section 963 (labeled "uW") for stack 949 only.

In one embodiment, memory RAID within a (p+1)-chip stack may be implemented by storing data across p chips and storing the parity (i.e. the error correction code or information) in a separate chip (i.e. the parity chip). So, when a block of data is written to the stack, the block is broken up into p equal sized portions and each portion of data is written to a separate chip in the stack. That is, the data is "striped" across p chips in the stack.

To illustrate, say that the memory controller writes data block A to the memory stack. The interface chip splits this data block into p equal sized portions ($A_1, A_2, A_3, \ldots, A_p$) and writes $A_1$ to the first chip in the stack, $A_2$ to the second chip, $A_3$ to the third chip, and so on, till $A_p$ is written to the $p^{th}$ chip in the stack. In addition, the parity information for the entire data block A is computed by the interface chip and stored in the parity chip. When the memory controller sends a read request for data block A, the interface chip reads $A_1$, $A_2, A_3, \ldots, A_p$ from the first, second, third, $\ldots$, $p^{th}$ chip respectively to form data block A. In addition, it reads the stored parity information for data block A. If the memory controller detects an error in the data read back from any of the chips in the stack, the memory controller may instruct the interface chip to re-create the correct data using the parity information and the correct portions of the data block A.

Figure 10A:
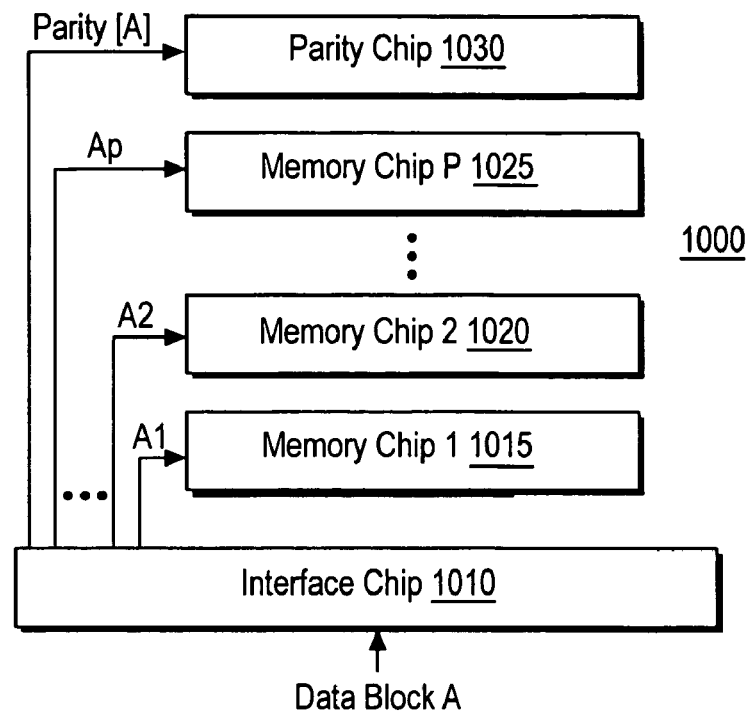
FIG. 10a is a block diagram illustrating a stack of memory chips with memory RAID capability during execution of a write operation.
Figure 10B:
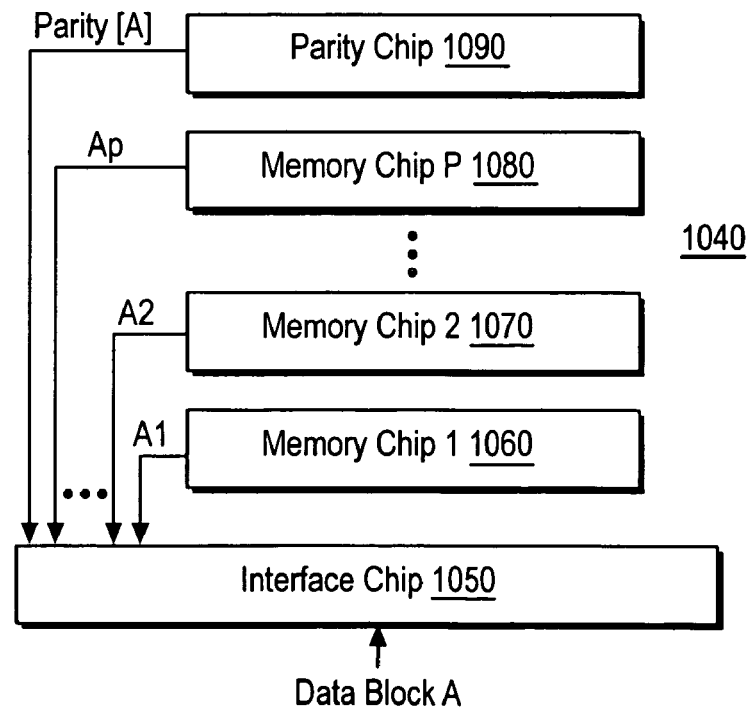
FIG. 10b is a block diagram illustrating a stack of memory chips with memory RAID capability during a read operation.

Embodiments for memory RAID within a memory stack are shown in FIGS. 10a and 10b.

FIG. 10a is a block diagram illustrating a stack of memory chips with memory RAID capability during execution of a write operation. Memory device 1000 includes an interface chip 1010 to interface "p+1" memory chips (1015, 1020, 1025, and 1030) to an external memory bus. FIG. 10a shows a write operation of a data block "A", wherein data for data block "A" is written into memory chips as follows.

A=Ap . . . A2, A1;
Parity[A]=(Ap)n . . . n(A2), n(A1),
wherein, "n" is the bitwise exclusive OR operator.

FIG. 10b is a block diagram illustrating a stack of memory chips with memory RAID capability during a read operation. Memory device 1040 includes interface chip 1050, "p" memory chips (1060, 1070 and 1080) and a parity memory chip 1090. For a read operation, data block "A" consists of A1, A2, . . . Ap and Parity[A], and is read from the respective memory chips as shown in FIG. 10b.

Note that this technique ensures that the data stored in each stack can recover from some types of errors. The memory controller may implement error correction across the data from all the memory stacks on a DIMM, and optionally, across multiple DIMMs.

In other embodiments the bits stored in the extra chip may have alternative functions than parity. As an example, the extra storage or hidden bit field may be used to tag a cacheline with the address of associated cachelines. Thus suppose the last time the memory controller fetched cacheline A, it also then fetched cacheline B (where B is a random address). The memory controller can then write back cacheline A with the address of cacheline B in the hidden bit field. Then the next time the memory controller reads cacheline A, it will also read the data in the hidden bit field and pre-fetch cacheline B. In yet other embodiments, metadata or cache tags or prefetch information may be stored in the hidden bit field.

Figure 11:
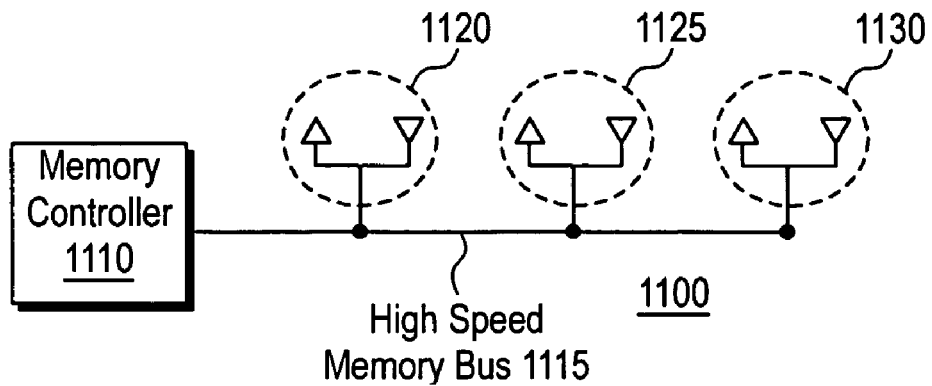
FIG. 11 illustrates conventional impedance loading as a result of adding DRAMs to a high-speed memory bus.

With conventional high speed DRAMs, addition of extra memory involves adding extra electrical loads on the high speed memory bus that connects the memory chips to the memory controller, as shown in FIG. 11.

FIG. 11 illustrates conventional impedance loading as a result of adding DRAMs to a high-speed memory bus. For this embodiment, memory controller 1110 accesses memory on high-speed bus 1115. The load of a conventional DRAM on high-speed memory bus 1115 is illustrated in FIG. 11 (1120). To add additional memory capacity in a conventional manner, memory chips are added to the high-speed bus 1115, and consequently additional loads (1125 and 1130) are also added to the high-speed memory bus 1115.

As the memory bus speed increases, the number of chips that can be connected in parallel to the memory bus decreases. This places a limit on the maximum memory capacity. Alternately stated, as the number of parallel chips on the memory bus increases, the speed of the memory bus must decrease. So, we have to accept lower speed (and lower memory performance) in order to achieve high memory capacity.

Separating a high speed DRAM into a high speed interface chip and a low speed memory chip facilitates easy addition of extra memory capacity without negatively impacting the memory bus speed and memory system performance. A single high speed interface chip can be connected to some or all of the lines of a memory bus, thus providing a known and fixed load on the memory bus. Since the other side of the interface chip runs at a lower speed, multiple low speed memory chips can be connected to (the low speed side of) the interface chip without sacrificing performance, thus providing the ability to upgrade memory. In effect, the electrical loading of additional memory chips has been shifted from a high speed bus (which is the case today with conventional high speed DRAMs) to a low speed bus. Adding additional electrical loads on a low speed bus is always a much easier problem to solve than that of adding additional electrical loads on a high speed bus.

Figure 12:
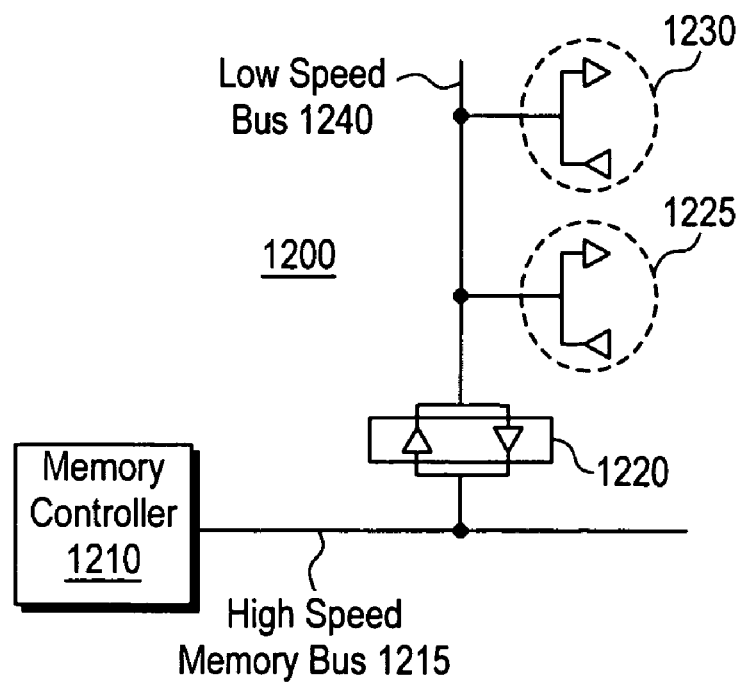
FIG. 12 illustrates impedance loading as a result of adding DRAMs to a high-speed memory bus in accordance with one embodiment.

FIG. 12 illustrates impedance loading as a result of adding DRAMs to a high-speed memory bus in accordance with one embodiment. For this embodiment, memory controller 1210 accesses a high-speed interface chip 1200 on high-speed memory bus 1215. The load 1220 from the high-speed interface chip is shown in FIG. 12. A low speed bus 1240 couples to high-speed interface chip 1200. The loads of the memory chips (1230 and 1225) are applied to low speed bus 1240. As a result, additional loads are not added to high-speed memory bus 1215.

The number of low speed memory chips that are connected to the interface chip may either be fixed at the time of the manufacture of the memory stack or may be changed after the manufacture. The ability to upgrade and add extra memory capacity after the manufacture of the memory stack is particularly useful in markets such as desktop PCs where the user may not have a clear understanding of the total system memory capacity that is needed by the intended applications. This ability to add additional memory capacity will become very critical when the PC industry adopts DDR3 memories in several major market segments such as desktops and mobile. The reason is that at DDR3 speeds, it is expected that only one DIMM can be supported per memory channel. This means that there is no easy way for the end user to add additional memory to the system after the system has been built and shipped.

Figure 13:
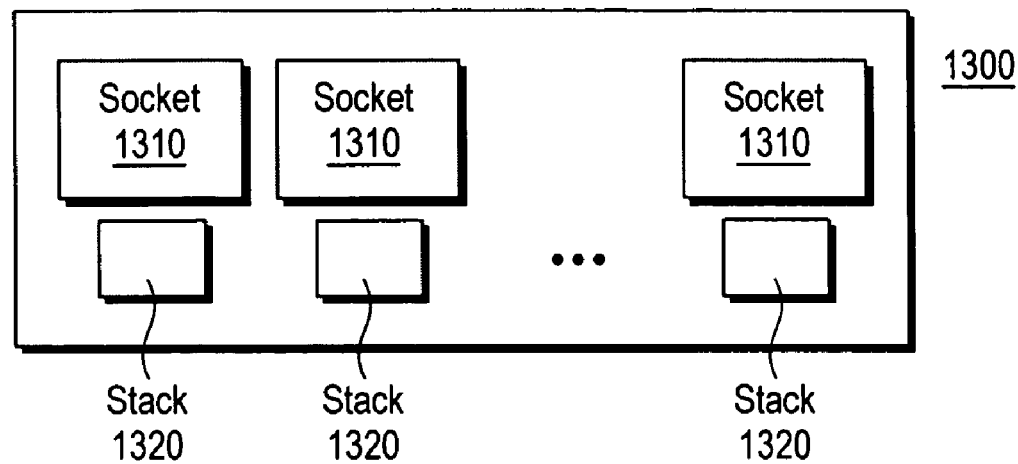
FIG. 13 is a block diagram illustrating one embodiment for adding low-speed memory chips using a socket.

In order to provide the ability to increase the memory capacity of a memory stack, a socket may be used to add at least one low speed memory chip. In one aspect, the socket can be on the same side of the printed circuit board (PCB) as the memory stack but be adjacent to the memory stack, wherein a memory stack may consist of at least one high speed interface chip or at least one high speed interface chip and at least one low speed memory chip. FIG. 13 is a block diagram illustrating one embodiment for adding low speed memory chips using a socket. For this embodiment, a printed circuit board (PCB) 1300, such as a DIMM, includes one or more stacks of high speed interface chips. In other embodiments, the stacks also include low-speed memory chips. As shown in FIG. 13, one or more sockets (1310) are mounted on the PCB 1300 adjacent to the stacks 1320. Low-speed memory chips may be added to the sockets to increase the memory capacity of the PCB 1300. Also, for this embodiment, the sockets 1310 are located on the same side of the PCB 1300 as stacks 1320.

Figure 14:
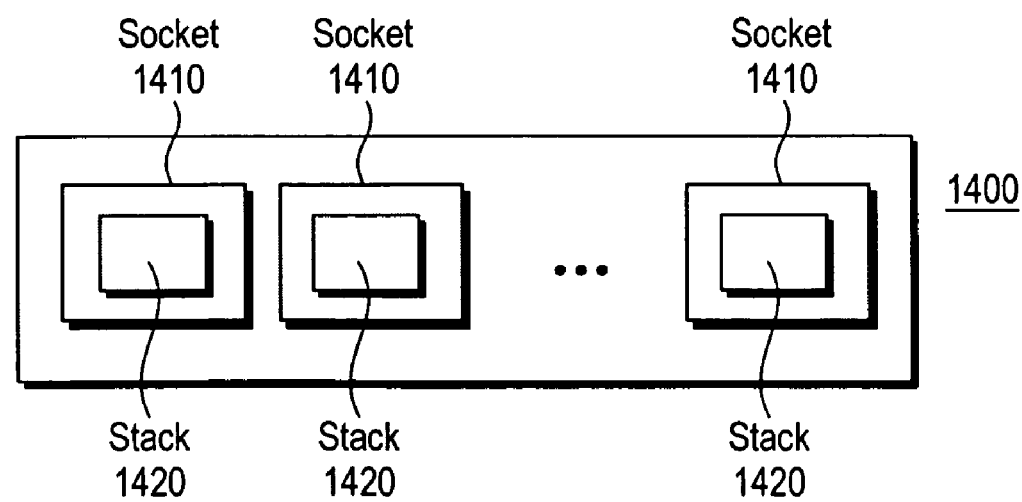
FIG. 14 illustrates a PCB with a socket located on top of a stack.

In situations where the PCB space is limited or the PCB dimensions must meet some industry standard or customer requirements, the socket for additional low speed memory chips can be designed to be on the same side of the PCB as the memory stack and sit on top of the memory stack, as shown in FIG. 14.

FIG. 14 illustrates a PCB with a socket located on top of a stack. PCB 1400 includes a plurality of stacks (1420). A stack contains a high speed interface chip and optionally, one or more low speed memory chips. For this embodiment, a socket (1410) sits on top of one or more stacks. Memory chips are placed in the socket(s) (1410) to add memory capacity to the PCB (e.g., DIMM). Alternately, the socket for the additional low speed memory chips can be designed to be on the opposite side of the PCB from the memory stack, as shown in FIG. 15.

Figure 15:
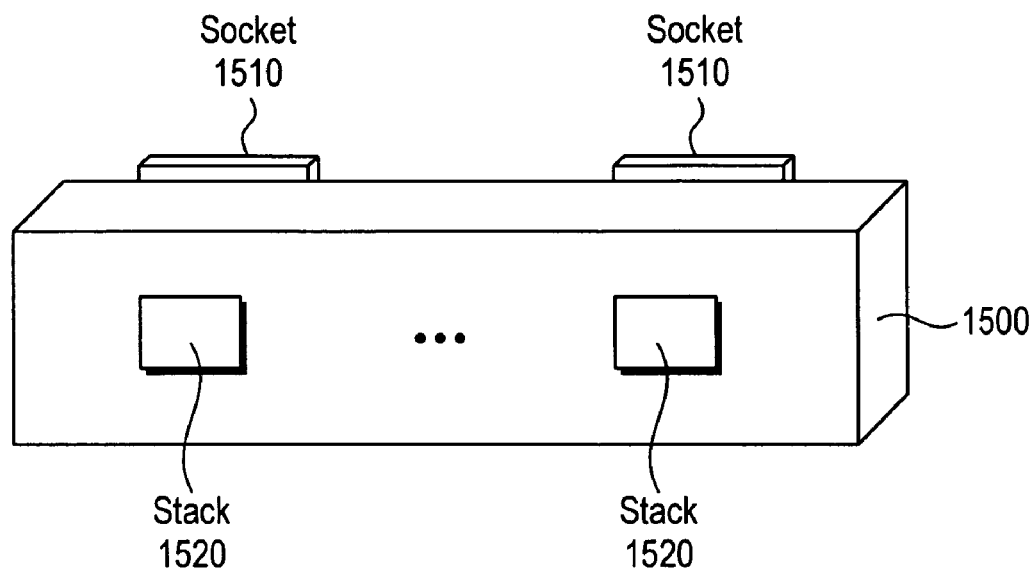
FIG. 15 illustrates a PCB with a socket located on the opposite side from the stack.

FIG. 15 illustrates a PCB with a socket located on the opposite side from the stack. For this embodiment, PCB 1500, such as a DIMM, comprises one or more stacks (1520) containing high speed interface chips, and optionally, one or more low speed memory chips. For this embodiment, one or more sockets (1510) are mounted on the opposite side of the PCB from the stack as shown in FIG. 15. The low speed memory chips may be added to the memory stacks one at a time. That is, each stack may have an associated socket. In this case, adding additional capacity to the memory system would involve adding one or more low speed memory chips to each stack in a memory rank (a rank denotes all the memory chips or stacks that respond to a memory access; i.e. all the memory chips or stacks that are enabled by a common Chip Select signal). Note that the same number and density of memory chips must be added to each stack in a rank. An alternative method might be to use a common socket for all the stacks in a rank. In this case, adding additional memory capacity might involve inserting a PCB into the socket, wherein the PCB contains multiple memory chips, and there is at least one memory chip for each stack in the rank. As mentioned above, the same number and density of memory chips must be added to each stack in the rank.

Many different types of sockets can be used. For example, the socket may be a female type and the PCB with the upgrade memory chips may have associated male pins.

Figure 16:
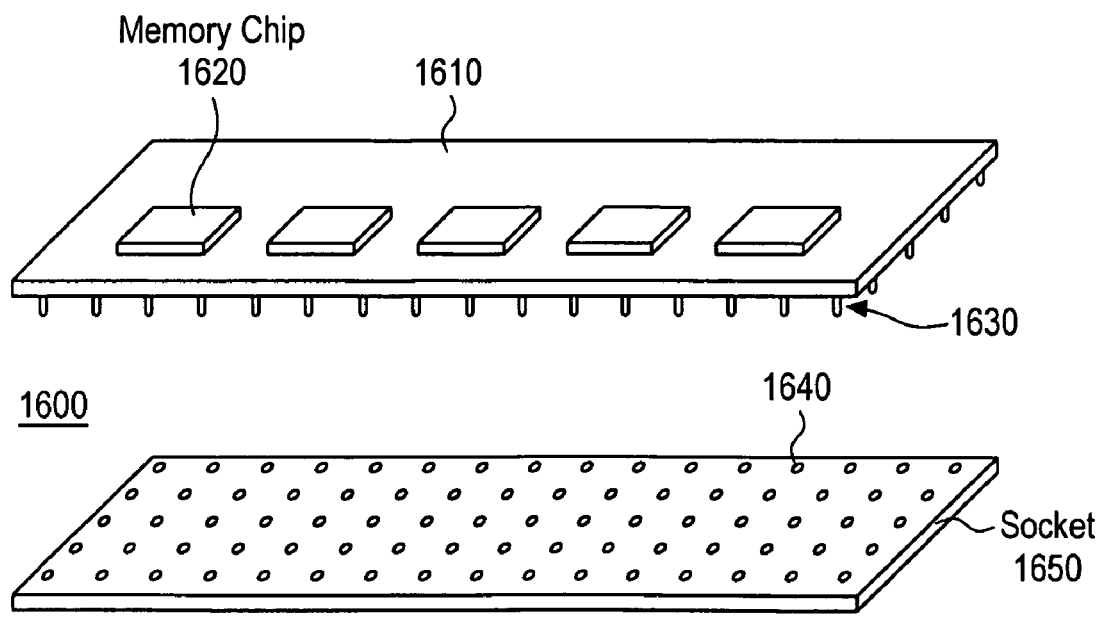
FIG. 16 illustrates an upgrade PCB that contains one or more memory chips.

FIG. 16 illustrates an upgrade PCB that contains one or more memory chips. For this embodiment, an upgrade PCB 1610 includes one or more memory chips (1620). As shown in FIG. 16, PCB 1610 includes male socket pins 1630. A female receptacle socket 1650 on a DIMM PCB mates with the male socket pins 1630 to upgrade the memory capacity to include additional memory chips (1620). Another approach would be to use a male type socket and an upgrade PCB with associated female receptacles.

Separating a high speed DRAM into a low speed memory chip and a high speed interface chip and stacking multiple memory chips behind an interface chip ensures that the performance penalty associated with stacking multiple chips is minimized. However, this approach requires changes to the architecture of current DRAMs, which in turn increases the time and cost associated with bringing this technology to the marketplace. A cheaper and quicker approach is to stack multiple off-the-shelf high speed DRAM chips behind a buffer chip but at the cost of higher latency.

Current off-the-shelf high speed DRAMs (such as DDR2 SDRAMs) use source synchronous strobe signals as the timing reference for bi-directional transfer of data. In the case of a 4-bit wide DDR or DDR2 SDRAM, a dedicated strobe signal is associated with the four data signals of the DRAM. In the case of an 8-bit wide chip, a dedicated strobe signal is associated with the eight data signals. For 16-bit and 32-bit chips, a dedicated strobe signal is associated with each set of eight data signals. Most memory controllers are designed to accommodate a dedicated strobe signal for every four or eight data lines in the memory channel or bus. Consequently, due to signal integrity and electrical loading considerations, most memory controllers are capable of connecting to only nine or 18 memory chips (in the case of a 72-bit wide memory channel) per rank. This limitation on connectivity means that two 4-bit wide high speed memory chips may be stacked on top of each other on an industry standard DIMM today, but that stacking greater than two chips is difficult. It should be noted that stacking two 4-bit wide chips on top of each other doubles the density of a DIMM. The signal integrity problems associated with more than two DRAMs in a stack make it difficult to increase the density of a DIMM by more than a factor of two today by using stacking techniques.

Using the stacking technique described below, it is possible to increase the density of a DIMM by four, six or eight times by correspondingly stacking four, six or eight DRAMs on top of each other. In order to do this, a buffer chip is located between the external memory channel and the DRAM chips and buffers at least one of the address, control, and data signals to and from the DRAM chips. In one implementation, one buffer chip may be used per stack. In other implementations, more than one buffer chip may be used per stack. In yet other implementations, one buffer chip may be used for a plurality of stacks.

Figure 17:
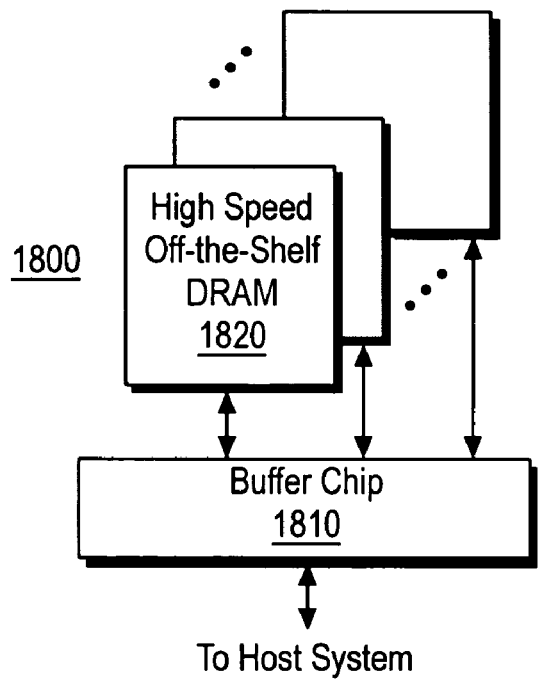
FIG. 17 is a block diagram illustrating one embodiment for stacking memory chips.

FIG. 17 is a block diagram illustrating one embodiment for stacking memory chips. For this embodiment, buffer chip 1810 is coupled to a host system, typically to the memory controller of the system. Memory device 1800 contains at least two high-speed memory chips 1820 (e.g., DRAMs such as DDR2 SDRAMs) stacked behind the buffer chip 1810 (e.g., the high-speed memory chips 1820 are accessed by buffer chip 1810).

It is clear that the embodiment shown in FIG. 17 is similar to that described previously and illustrated in FIG. 3. The main difference is that in the scheme illustrated in FIG. 3, multiple low speed memory chips were stacked on top of a high speed interface chip. The high speed interface chip presented an industry-standard interface (such as DDR SDRAM or DDR2 SDRAM) to the host system while the interface between the high speed interface chip and the low speed memory chips may be non-standard (i.e. proprietary) or may conform to an industry standard. The scheme illustrated in FIG. 17, on the other hand, stacks multiple high speed, off-the-shelf DRAMs on top of a high speed buffer chip. The buffer chip may or may not perform protocol translation (i.e. the buffer chip may present an industry-standard interface such as DDR2 to both the external memory channel and to the high speed DRAM chips) and may simply isolate the electrical loads represented by the memory chips (i.e. the input parasitics of the memory chips) from the memory channel.

In other implementations the buffer chip may perform protocol translations. For example, the buffer chip may provide translation from DDR3 to DDR2. In this fashion, multiple DDR2 SDRAM chips might appear to the host system as one or more DDR3 SDRAM chips. The buffer chip may also translate from one version of a protocol to another version of the same protocol. As an example of this type of translation, the buffer chip may translate from one set of DDR2 parameters to a different set of DDR2 parameters. In this way the buffer chip might, for example, make one or more DDR2 chips of one type (e.g. 4-4-4 DDR2 SDRAM) appear to the host system as one of more DDR2 chips of a different type (e.g. 6-6-6 DDR2 SDRAM). Note that in other implementations, a buffer chip may be shared by more than one stack. Also, the buffer chip may be external to the stack rather than being part of the stack. More than one buffer chip may also be associated with a stack.

Using a buffer chip to isolate the electrical loads of the high speed DRAMs from the memory channel allows us to stack multiple (typically between two and eight) memory chips on top of a buffer chip. In one embodiment, all the memory chips in a stack may connect to the same address bus. In another embodiment, a plurality of address buses may connect to the memory chips in a stack, wherein each address bus connects to at least one memory chip in the stack. Similarly, the data and strobe signals of all the memory chips in a stack may connect to the same data bus in one embodiment, while in another embodiment, multiple data buses may connect to the data and strobe signals of the memory chips in a stack, wherein each memory chip connects to only one data bus and each data bus connects to at least one memory chip in the stack.

Using a buffer chip in this manner allows a first number of DRAMS to simulate at least one DRAM of a second number. In the context of the present description, the simulation may refer to any simulating, emulating, disguising, and/or the like that results in at least one aspect (e.g. a number in this embodiment, etc.) of the DRAMs appearing different to the system. In different embodiments, the simulation may be electrical in nature, logical in nature, and/or performed in any other desired manner. For instance, in the context of electrical simulation, a number of pins, wires, signals, etc. may be simulated, while, in the context of logical simulation, a particular function may be simulated.

In still additional aspects of the present embodiment, the second number may be more or less than the first number. Still yet, in the latter case, the second number may be one, such that a single DRAM is simulated. Different optional embodiments which may employ various aspects of the present embodiment will be set forth hereinafter.

In still yet other embodiments, the buffer chip may be operable to interface the DRAMs and the system for simulating at least one DRAM with at least one aspect that is different from at least one aspect of at least one of the plurality of the DRAMs. In accordance with various aspects of such embodiment, such aspect may include a signal, a capacity, a timing, a logical interface, etc. Of course, such examples of aspects are set forth for illustrative purposes only and thus should not be construed as limiting, since any aspect associated with one or more of the DRAMs may be simulated differently in the foregoing manner.

In the case of the signal, such signal may include an address signal, control signal, data signal, and/or any other signal, for that matter. For instance, a number of the aforementioned signals may be simulated to appear as fewer or more signals, or even simulated to correspond to a different type. In still other embodiments, multiple signals may be combined to simulate another signal. Even still, a length of time in which a signal is asserted may be simulated to be different.

In the case of capacity, such may refer to a memory capacity (which may or may not be a function of a number of the DRAMs). For example, the buffer chip may be operable for simulating at least one DRAM with a first memory capacity that is greater than (or less than) a second memory capacity of at least one of the DRAMs.

In the case where the aspect is timing-related, the timing may possibly relate to a latency (e.g. time delay, etc.). In one aspect of the present embodiment, such latency may include a column address strobe (CAS) latency (tCAS), which refers to a latency associated with accessing a column of data. Still yet, the latency may include a row address strobe (RAS) to CAS latency (tRCD), which refers to a latency required between RAS and CAS. Even still, the latency may include a row precharge latency (tRP), which refers a latency required to terminate access to an open row. Further, the latency may include an active to precharge latency (tRAS), which refers to a latency required to access a certain row of data between a data request and a precharge command. In any case, the buffer chip may be operable for simulating at least one DRAM with a first latency that is longer (or shorter) than a second latency of at least one of the DRAMs. Different optional embodiments which employ various features of the present embodiment will be set forth hereinafter.

In still another embodiment, a buffer chip may be operable to receive a signal from the system and communicate the signal to at least one of the DRAMs after a delay. Again, the signal may refer to an address signal, a command signal (e.g. activate command signal, precharge command signal, a write signal, etc.) data signal, or any other signal for that matter. In various embodiments, such delay may be fixed or variable.

As an option, the delay may include a cumulative delay associated with any one or more of the aforementioned signals. Even still, the delay may time shift the signal forward and/or back in time (with respect to other signals). Of course, such forward and backward time shift may or may not be equal in magnitude. In one embodiment, this time shifting may be accomplished by utilizing a plurality of delay functions which each apply a different delay to a different signal.

Further, it should be noted that the aforementioned buffer chip may include a register, an advanced memory buffer (AMB), a component positioned on at least one DIMM, a memory controller, etc. Such register may, in various embodiments, include a Joint Electron Device Engineering Council (JEDEC) register, a JEDEC register including one or more functions set forth herein, a register with forwarding, storing, and/or buffering capabilities, etc. Different optional embodiments, which employ various features, will be set forth hereinafter.

In various embodiments, it may be desirable to determine whether the simulated DRAM circuit behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard defines commands that a DRAM circuit must accept and the behavior of the DRAM circuit as a result of such commands. For example, the JEDEC specification for a DDR2 DRAM is known as JESD79-2B.

If it is desired, for example, to determine whether a JEDEC standard is met, the following algorithm may be used. Such algorithm checks, using a set of software verification tools for formal verification of logic, that protocol behavior of the simulated DRAM circuit is the same as a desired standard or other design specification. This formal verification is quite feasible because the DRAM protocol described in a DRAM standard is typically limited to a few protocol commands (e.g. approximately 15 protocol commands in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, and others. These software verification tools use written assertions that correspond to the rules established by the DRAM protocol and specification. These written assertions are further included in the code that forms the logic description for the buffer chip. By writing assertions that correspond to the desired behavior of the simulated DRAM circuit, a proof may be constructed that determines whether the desired design requirements are met. In this way, one may test various embodiments for compliance with a standard, multiple standards, or other design specification.

For instance, an assertion may be written that no two DRAM control signals are allowed to be issued to an address, control and clock bus at the same time. Although one may know which of the various buffer chip and DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for the buffer chip with other bus arrangements or alternative designs for the interconnect between the buffer chip and other components may be used and tested for compliance with the desired standard or other design specification.

The buffer chip may be designed to have the same footprint (or pin out) as an industry-standard DRAM (e.g. a DDR2 SDRAM footprint). The high speed DRAM chips that are stacked on top of the buffer chip may either have an industry-standard pin out or can have a non-standard pin out. This allows us to use a standard DIMM PCB since each stack has the same footprint as a single industry-standard DRAM chip. Several companies have developed proprietary ways to stack multiple DRAMs on top of each other (e.g. µZ Ball Stack from Tessera, Inc., High Performance Stakpak from Staktek Holdings, Inc.). The disclosed techniques of stacking multiple memory chips behind either a buffer chip (FIG. 18) or a high speed interface chip (FIG. 3) is compatible with all the different ways of stacking memory chips. It does not require any particular stacking technique.

A double sided DIMM (i.e. a DIMM that has memory chips on both sides of the PCB) is electrically worse than a single sided DIMM, especially if the high speed data and strobe signals have to be routed to two DRAMs, one on each side of the board. This implies that the data signal might have to split into two branches (i.e. a T topology) on the DIMM, each branch terminating at a DRAM on either side of the board. A T topology is typically worse from a signal integrity perspective than a point-to-point topology. Rambus used mirror packages on double sided Rambus In-line Memory Modules (RIMMs) so that the high speed signals had a point-to-point topology rather than a T topology. This has not been widely adopted by the DRAM makers mainly because of inventory concerns. In this disclosure, the buffer chip may be designed with an industry-standard DRAM pin out and a mirrored pin out. The DRAM chips that are stacked behind the buffer chip may have a common industry-standard pin out, irrespective of whether the buffer chip has an industry-standard pin out or a mirrored pin out. This allows us to build double sided DIMMs that are both high speed and high capacity by using mirrored packages and stacking respectively, while still using off-the-shelf DRAM chips. Of course, this requires the use of a non-standard DIMM PCB since the standard DIMM PCBs are all designed to accommodate standard (i.e. non-mirrored) DRAM packages on both sides of the PCB.

In another aspect, the buffer chip may be designed not only to isolate the electrical loads of the stacked memory chips from the memory channel but also have the ability to provide redundancy features such as memory sparing, memory mirroring, and memory RAID. This allows us to build high density DIMMs that not only have the same footprint (i.e. pin compatible) as industry-standard memory modules but also provide a full suite of redundancy features. This capability is important for key segments of the server market such as the blade server segment and the 1U rack server segment, where the number of DIMM slots (or connectors) is constrained by the small form factor of the server motherboard. Many analysts have predicted that these will be the fastest growing segments in the server market.

Memory sparing may be implemented with one or more stacks of p+q high speed memory chips and a buffer chip. The p memory chips of each stack are assigned to the working pool and are available to system resources such as the operating system (OS) and application software. When the memory controller (or optionally the AMB) detects that one of the memory chips in the stack's working pool has, for example, generated an uncorrectable multi-bit error or has generated correctable errors that exceeded a pre-defined threshold, it may choose to replace the faulty chip with one of the q chips that have been placed in the spare pool. As discussed previously, the memory controller may choose to do the sparing across all the stacks in a rank even though only one working chip in one specific stack triggered the error condition, or may choose to confine the sparing operation to only the specific stack that triggered the error condition. The former method is simpler to implement from the memory controller's perspective while the latter method is more fault-tolerant. Memory sparing was illustrated in FIG. 8 for stacks built with a high speed interface chip and multiple low speed DRAMs. The same method is applicable to stacks built with high speed, off-the-shelf DRAMs and a buffer chip. In other implementations, the buffer chip may not be part of the stack. In yet other implementations, a buffer chip may be used with a plurality of stacks of memory chips or a plurality of buffer chips may be used by a single stack of memory chips.

Memory mirroring can be implemented by dividing the high speed memory chips in a stack into two equal sets—a working set and a mirrored set. When the memory controller writes data to the memory, the buffer chip writes the data to the same location in both the working set and the mirrored set. During reads, the buffer chip returns the data from the working set. If the returned data had an uncorrectable error condition or if the cumulative correctable errors in the returned data exceeded a pre-defined threshold, the memory controller may instruct the buffer chip to henceforth return data (on memory reads) from the mirrored set until the error condition in the working set has been rectified. The buffer chip may continue to send writes to both the working set and the mirrored set or may confine it to just the mirrored set. As discussed before, the memory mirroring operation may be triggered simultaneously on all the memory stacks in a rank or may be done on a per-stack basis as and when necessary. The former method is easier to implement while the latter method provides more fault tolerance. Memory mirroring was illustrated in FIG. 9 for stacks built with a high speed interface chip and multiple low speed memory chips. The same method is applicable to stacks built with high speed, off-the-shelf DRAMs and a buffer chip. In other implementations, the buffer chip may not be part of the stack. In yet other implementations, a buffer chip may be used with a plurality of stacks of memory chips or a plurality of buffer chips may be used by a single stack of memory chips.

Implementing memory mirroring within a stack has one drawback, namely that it does not protect against the failure of the buffer chip associated with a stack. In this case, the data in the memory is mirrored in two different memory chips in a stack but both these chips have to communicate to the host system through the common associated buffer chip. So, if the buffer chip in a stack were to fail, the mirrored memory capability is of no use. One solution to this problem is to group all the chips in the working set into one stack and group all the chips in the mirrored set into another stack. The working stack may now be on one side of the DIMM PCB while the mirrored stack may be on the other side of the DIMM PCB. So, if the buffer chip in the working stack were to fail now, the memory controller may switch to the mirrored stack on the other side of the PCB.

The switch from the working set to the mirrored set may be triggered by the memory controller (or AMB) sending an in-band or sideband signal to the buffers in the respective stacks. Alternately, logic may be added to the buffers so that the buffers themselves have the ability to switch from the working set to the mirrored set. For example, some of the server memory controller hubs (MCH) from Intel will read a memory location for a second time if the MCH detects an uncorrectable error on the first read of that memory location. The buffer chip may be designed to keep track of the addresses of the last m reads and to compare the address of the current read with the stored m addresses. If it detects a match, the most likely scenario is that the MCH detected an uncorrectable error in the data read back and is attempting a second read to the memory location in question. The buffer chip may now read the contents of the memory location from the mirrored set since it knows that the contents in the corresponding location in the working set had an error. The buffer chip may also be designed to keep track of the number of such events (i.e. a second read to a location due to an uncorrectable error) over some period of time. If the number of these events exceeded a certain threshold within a sliding time window, then the buffer chip may permanently switch to the mirrored set and notify an external device that the working set was being disabled.

Implementing memory RAID within a stack that consists of high speed, off-the-shelf DRAMs is more difficult than implementing it within a stack that consists of non-standard DRAMs. The reason is that current high speed DRAMs have a minimum burst length that require a certain amount of information to be read from or written to the DRAM for each read or write access respectively. For example, an n-bit wide DDR2 SDRAM has a minimum burst length of 4 which means that for every read or write operation, 4n bits must be read from or written to the DRAM. For the purpose of illustration, the following discussion will assume that all the DRAMs that are used to build stacks are 8-bit wide DDR2 SDRAMs, and that each stack has a dedicated buffer chip.

Given that 8-bit wide DDR2 SDRAMs are used to build the stacks, eight stacks will be needed per memory rank (ignoring the ninth stack needed for ECC). Since DDR2 SDRAMs have a minimum burst length of four, a single read or write operation involves transferring four bytes of data between the memory controller and a stack. This means that the memory controller must transfer a minimum of 32 bytes of data to a memory rank (four bytes per stack * eight stacks) for each read or write operation. Modern CPUs typically use a 64-byte cacheline as the basic unit of data transfer to and from the system memory. This implies that eight bytes of data may be transferred between the memory controller and each stack for a read or write operation.

In order to implement memory RAID within a stack, we may build a stack that contains 3 8-bit wide DDR2 SDRAMs and a buffer chip. Let us designate the three DRAMs in a stack as chips A, B, and C. Consider the case of a memory write operation where the memory controller performs a burst write of eight bytes to each stack in the rank (i.e. memory controller sends 64 bytes of data—one cacheline—to the entire rank). The buffer chip may be designed such that it writes the first four bytes (say, bytes Z0, Z1, Z2, and Z3) to the specified memory locations (say, addresses x1, x2, x3, and x4) in chip A and writes the second four bytes (say, bytes Z4, Z5, Z6, and Z7) to the same locations (i.e. addresses x1, x2, x3, and x4) in chip B. The buffer chip may also be designed to store the parity information corresponding to these eight bytes in the same locations in chip C. That is, the buffer chip will store $P_{[0,4]}=Z0{\char94}Z4$ in address x1 in chip C, $P_{[1,5]}=Z1{\char94}Z5$ in address x2 in chip C, $P_{[2,6]}=Z2{\char94}Z6$ in address x3 in chip C, and $P_{[3,7]}=Z3{\char94}Z7$ in address x4 in chip C, where ^ is the bitwise exclusive-OR operator. So, for example, the least significant bit (bit 0) of $P_{[0,4]}$ is the exclusive-OR of the least significant bits of Z0 and Z4, bit 1 of $P_{[0,4]}$ is the exclusive-OR of bit 1 of Z0 and bit 1 of Z4, and so on. Note that other striping methods may also be used. For example, the buffer chip may store bytes Z0, Z2, Z4, and Z6 in chip A and bytes Z1, Z3, Z5, and Z7 in chip B.

Now, when the memory controller reads the same cacheline back, the buffer chip will read locations x1, x2, x3, and x4 in both chips A and B and will return bytes Z0, Z1, Z2, and Z3 from chip A and then bytes Z4, Z5, Z6, and Z7 from chip B. Now let us assume that the memory controller detected a multi-bit error in byte Z1. As mentioned previously, some of the Intel server MCHs will re-read the address location when they detect an uncorrectable error in the data that was returned in response to the initial read command. So, when the memory controller re-reads the address location corresponding to byte Z1, the buffer chip may be designed to detect the second read and return $P_{[1,5]}{\char94}Z5$ rather than Z1 since it knows that the memory controller detected an uncorrectable error in Z1.

Note that the behavior of the memory controller after the detection of an uncorrectable error will influence the error recovery behavior of the buffer chip. For example, if the memory controller reads the entire cacheline back in the event of an uncorrectable error but requests the burst to start with the bad byte, then the buffer chip may be designed to look at the appropriate column addresses to determine which byte corresponds to the uncorrectable error. For example, say that byte Z1 corresponds to the uncorrectable error and that the memory controller requests that the stack send the eight bytes (Z0 through Z7) back to the controller starting with byte Z1. In other words, the memory controller asks the stack to send the eight bytes back in the following order: Z1, Z2, Z3, Z0, Z5, Z6, Z7, and Z4 (i.e. burst length=8, burst type=sequential, and starting column address A[2:0]=001b). The buffer chip may be designed to recognize that this indicates that byte Z1 corresponds to the uncorrectable error and return $P_{[1,5]}{\char94}Z5$, Z2, Z3, Z0, Z5, Z6, Z7, and Z4. Alternately, the buffer chip may be designed to return $P_{[1,5]}{\char94}Z5$, $P_{[2,6]}{\char94}Z6$, $P_{[3,7]}{\char94}Z7$, $P_{[0,4]}{\char94}Z4$, Z5, Z6, Z7, and Z4 if it is desired to correct not only an uncorrectable error in any given byte but also the case where an entire chip (in this case, chip A) fails. If, on the other hand, the memory controller reads the entire cacheline in the same order both during a normal read operation and during a second read caused by an uncorrectable error, then the controller has to indicate to the buffer chip which byte or chip corresponds to the uncorrectable error either through an in-band signal or through a sideband signal before or during the time it performs the second read.

However, it may be that the memory controller does a 64-byte cacheline read or write in two separate bursts of length 4 (rather than a single burst of length 8). This may also be the case when an I/O device initiates the memory access. This may also be the case if the 64-byte cacheline is stored in parallel in two DIMMs. In such a case, the memory RAID implementation might require the use of the DM (Data Mask) signal. Again, consider the case of a 3-chip stack that is built with 3 8-bit wide DDR2 SDRAMs and a buffer chip. Memory RAID requires that the 4 bytes of data that are written to a stack be striped across the two memory chips (i.e. 2 bytes be written to each of the memory chips) while the parity is computed and stored in the third memory chip. However, the DDR2 SDRAMs have a minimum burst length of 4, meaning that the minimum amount of data that they are designed to transfer is 4 bytes. In order to satisfy both these requirements, the buffer chip may be designed to use the DM signal to steer two of the four bytes in a burst to chip A and steer the other two bytes in a burst to chip B. This concept is best illustrated by the example below.

Say that the memory controller sends bytes Z0, Z1, Z2, and Z3 to a particular stack when it does a 32-byte write to a memory rank, and that the associated addresses are x1, x2, x3, and x4. The stack in this example is composed of three 8-bit DDR2 SDRAMs (chips A, B, and C) and a buffer chip. The buffer chip may be designed to generate a write command to locations x1 x2, x3, and x4 on all the three chips A, B, and C, and perform the following actions:

Write Z0 and Z2 to chip A and mask the writes of Z1 and Z3 to chip A

Write Z1 and Z3 to chip B and mask the writes of Z0 and Z2 to chip B

Write (Z0^Z1) and (Z2^Z3) to chip C and mask the other two writes

Figure 18:
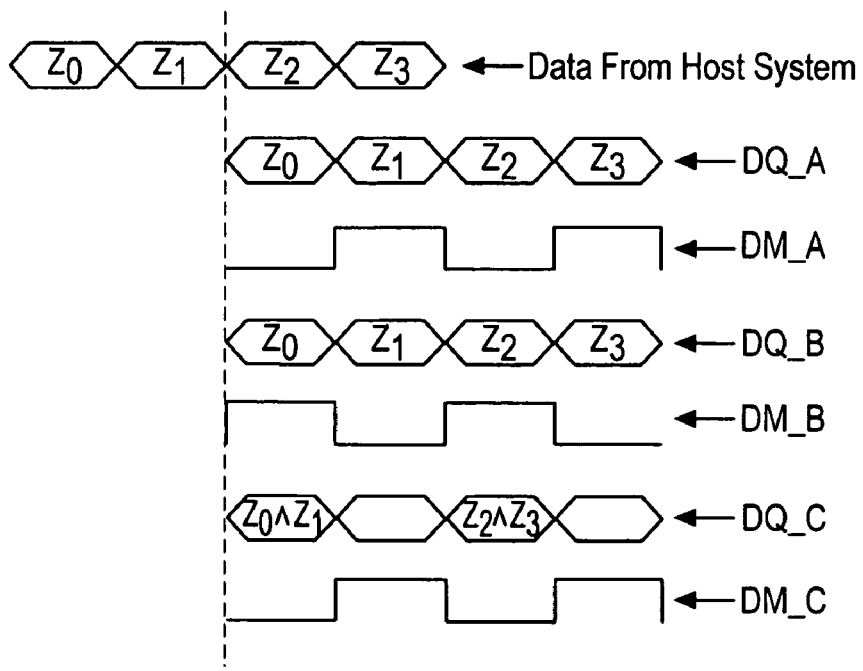
FIG. 18 is a timing diagram for implementing memory RAID using a datamask ("DM") signal in a three chip stack composed of 8 bit wide DDR2 SDRAMS.

This of course requires that the buffer chip have the capability to do a simple address translation so as to hide the implementation details of the memory RAID from the memory controller. FIG. 18 is a timing diagram for implementing memory RAID using a datamask (DM) signal in a three chip stack composed of 8 bit wide DDR2 SDRAMS. The first signal of the timing diagram of FIG. 18 represents data sent to the stack from the host system. The second and third signals, labeled DQ_A and DM_A, represent the data and data mask signals sent by the buffer chip to chip A during a write operation to chip A. Similarly, signals DQ_B and DM_B represent signals sent by the buffer chip to chip B during a write operation to chip B, and signals DQ_C and DM_C represent signals sent by the buffer chip to chip C during a write operation to chip C.

Now when the memory controller reads back bytes Z0, Z1, Z2, and Z3 from the stack, the buffer chip will read locations x1, x2, x3, and x4 from both chips A and B, select the appropriate two bytes from the four bytes returned by each chip, re-construct the original data, and send it back to the memory controller. It should be noted that the data striping across the two chips may be done in other ways. For example, bytes Z0 and Z1 may be written to chip A and bytes Z2 and Z3 may be written to chip B. Also, this concept may be extended to stacks that are built with a different number of chips. For example, in the case of stack built with five 8-bit wide DDR2 SDRAM chips and a buffer chip, a 4-byte burst to a stack may be striped across four chips by writing one byte to each chip and using the DM signal to mask the remaining three writes in the burst. The parity information may be stored in the fifth chip, again using the associated DM signal.

As described previously, when the memory controller (or AMB) detects an uncorrectable error in the data read back, the buffer chip may be designed to re-construct the bad data using the data in the other chips as well as the parity information. The buffer chip may perform this operation either when explicitly instructed to do so by the memory controller or by monitoring the read requests sent by the memory controller and detecting multiple reads to the same address within some period of time, or by some other means.

Re-constructing bad data using the data from the other memory chips in the memory RAID and the parity data will require some additional amount of time. That is, the memory read latency for the case where the buffer chip has to re-construct the bad data may most likely be higher than the normal read latency. This may be accommodated in multiple ways. Say that the normal read latency is 4 clock cycles while the read latency when the buffer chip has to re-create the bad data is 5 clock cycles. The memory controller may simply choose to use 5 clock cycles as the read latency for all read operations. Alternately, the controller may default to 4 clock cycles for all normal read operations but switch to 5 clock cycles when the buffer chip has to re-create the data. Another option would be for the buffer chip to stall the memory controller when it has to re-create some part of the data. These and other methods fall within the scope of this disclosure.

As discussed above, we can implement memory RAID using a combination of memory chips and a buffer chip in a stack. This provides us with the ability to correct multi-bit errors either within a single memory chip or across multiple memory chips in a rank. However, we can create an additional level of redundancy by adding additional memory chips to the stack. That is, if the memory RAID is implemented across 71 chips (where the data is striped across n−1 chips and the parity is stored in the $n^{th}$ chip), we can create another level of redundancy by building the stack with at least n+1 memory chips. For the purpose of illustration, assume that we wish to stripe the data across two memory chips (say, chips A and B). We need a third chip (say, chip C) to store the parity information. By adding a fourth chip (chip D) to the stack, we can create an additional level of redundancy. Say that chip B has either failed or is generating an unacceptable level of uncorrectable errors. The buffer chip in the stack may re-construct the data in chip B using the data in chip A and the parity information in chip C in the same manner that is used in well-known disk RAID systems. Obviously, the performance of the memory system may be degraded (due to the possibly higher latency associated with re-creating the data in chip B) until chip B is effectively replaced. However, since we have an unused memory chip in the stack (chip D), we may substitute it for chip B until the next maintenance operation. The buffer chip may be designed to re-create the data in chip B (using the data in chip A and the parity information in chip C) and write it to chip D. Once this is completed, chip B may be discarded (i.e. no longer used by the buffer chip). The re-creation of the data in chip B and the transfer of the re-created data to chip D may be made to run in the background (i.e. during the cycles when the rank containing chips A, B, C, and D are not used) or may be performed during cycles that have been explicitly scheduled by the memory controller for the data recovery operation.

The logic necessary to implement the higher levels of memory protection such as memory sparing, memory mirroring, and memory RAID may be embedded in a buffer chip associated with each stack or may be implemented in a "more global" buffer chip (i.e. a buffer chip that buffers more data bits than is associated with an individual stack). For example, this logic may be embedded in the AMB. This variation is also covered by this disclosure.

The method of adding additional low speed memory chips behind a high speed interface by means of a socket was disclosed. The same concepts (see FIGS. 12, 13, 14, and 15) are applicable to stacking high speed, off-the-shelf DRAM chips behind a buffer chip. This is also covered by this invention.

Although the present invention has been described in terms of specific exemplary embodiments, it will be appreciated that various modifications and alterations might be made by those skilled in the art without departing from the spirit and scope of the invention.

The invention claimed is:

1. A memory device for electrical connection to a memory bus, the memory device comprising:
   a plurality of dynamic random access memory ("DRAM") integrated circuits, stacked in a vertical direction, each DRAM integrated circuit comprising a memory core of a plurality of cells and accessible at a first speed; and
   an interface integrated circuit electrically coupled to the plurality of DRAM integrated circuits for providing an interface between the DRAM integrated circuits and the memory bus at a speed greater than the first speed;

wherein the interface integrated circuit is adapted for providing a predetermined electrical load on the memory bus independent of a number of the DRAM integrated circuits to which the interface integrated circuit is electrically coupled.

2. The memory device as set forth in claim 1, wherein:
each DRAM integrated circuit comprises a DRAM integrated circuit die.

3. The memory device as set forth in claim 1, wherein:
the plurality of DRAM integrated circuits comprises a DRAM integrated circuit package.

4. The memory device as set forth in claim 1, wherein:
the interface integrated circuit is adapted to operate in accordance with an industry defined specification.

5. The memory device as set forth in claim 1, wherein:
the interface integrated circuit is adapted to operate in accordance with a DDR2 SRAM specification.

6. A memory device for electrical connection to a memory bus, the memory device comprising:
a plurality of dynamic random access memory ("DRAM") integrated circuits, stacked in a vertical direction, each DRAM integrated circuit comprisina a memory core of a plurality of cells and accessible at a first speed; and
an interface integrated circuit electrically coupled to the plurality of DRAM integrated circuits for providing an interface between the DRAM integrated circuits and the memory bus at a speed greater than the first speed;
wherein the plurality of DRAM integrated circuits comprise:
a working pool of "p" DRAM integrated circuits; and
a spare pool of "q" DRAM integrated circuits;
wherein "p" and "q" comprise integer values.

7. The memory device as set forth in claim 6, further comprising:
a memory controller, coupled to at least one of the interface integrated circuit and the plurality of DRAM integrated circuits, for detecting occurrence of a pre-defined number of errors in working memory integrated circuits and for signaling to the interface integrated circuit to indicate the occurrence of the pre-defined number of errors; and
wherein the interface integrated circuit is adapted to replace at least one DRAM integrated circuit of the working pool with at least one DRAM integrated circuit of the spare pool.

8. The memory device as set forth in claim 7, wherein:
the memory controller is further adapted to signal the occurrence of the pre-defined number of errors using in-band signaling.

9. The memory device as set forth in claim 7, wherein:
the memory controller is further adapted to signal the occurrence of the pre-defined number of errors using side band signaling.

10. A memory device for electrical connection to a memory bus, the memory device comprising:
a plurality of dynamic random access memory ("DRAM") integrated circuits, stacked in a vertical direction, each DRAM integrated circuit comprising a memory core of a plurality of cells and accessible at a first speed; and
an interface integrated circuit electrically coupled to the plurality of DRAM integrated circuits for providing an interface between the DRAM integrated circuits and the memory bus at a speed greater than the first speed;
wherein the plurality of DRAM integrated circuits comprise:
a working pool of "p" DRAM integrated circuits; and
a mirrored pool of "q" DRAM integrated circuits;
wherein "p" and "q" comprise integer values.

11. The memory device as set forth in claim 10, further comprising:
a memory controller, coupled to at least one of the interface integrated circuit and the plurality of DRAM integrated circuits, for detecting occurrence of a pre-defined number of errors in working memory integrated circuits and for signaling to the interface integrated circuit to indicate the occurrence of the pre-defined number of errors; and
wherein the interface integrated circuit is adapted to replace at least one DRAM integrated circuit of the working pool with at least one DRAM integrated circuit of the mirrored pool.

12. The memory device as set forth in claim 11, wherein:
the memory controller is further adapted to signal the occurrence of the pre-defined number of errors using in-band signaling.

13. The memory device as set forth in claim 11, wherein:
the memory controller is further adapted to signal the occurrence of the pre-defined number of errors using side band signaling.

14. The memory device as set forth in claim 10, wherein:
"p" equals "q".

15. A memory device for electrical connection to a memory bus, the memory device comprising:
a plurality of dynamic random access memory ("DRAM") integrated circuits, stacked in a vertical direction, each DRAM integrated circuit comprising a memory core of a plurality of cells and accessible at a first speed;
an interface integrated circuit electrically coupled to the plurality of DRAM integrated circuits for providing an interface between the DRAM integrated circuits and the memory bus at a speed greater than the first speed; and
a memory scheme wherein the plurality of DRAM integrated circuits comprise;
"p" DRAM integrated circuits used as a working memory device for storing data across the "p" DRAM integrated circuits; and
at least one additional DRAM integrated circuit for storing additional information for the data stored in the "p" DRAM integrated circuits;
wherein "p" comprises an integer value.

16. The memory device as set forth in claim 15, wherein:
the memory scheme comprises a RAID memory scheme; and
the additional information comprises parity information.

17. The memory device as set forth in claim 15, wherein:
the additional information comprises prefetch information.

18. A memory device for electrical connection to a memory bus, the memory device comprising:
a plurality of dynamic random access memory ("DRAM") integrated circuits, stacked in a vertical direction, each DRAM integrated circuit comprising a memory core of a plurality of cells and accessible at a first speed;
an interface integrated circuit electrically coupled to the plurality of DRAM integrated circuits for providing an interface between the DRAM integrated circuits and the memory bus at a speed greater than the first speed; and a socket, coupled to the stacked plurality of DRAM integrated circuits, for adding at least one additional DRAM integrated circuit to the stacked plurality of DRAM integrated circuits.

19. The memory device as set forth in claim 18, wherein: the interface integrated circuit is stacked with the plurality of DRAM integrated circuits.

20. A memory device for electrical connection to a memory bus, the memory device comprising:
   a plurality of dynamic random access memory ("DRAM") integrated circuits, stacked in a vertical direction, each DRAM integrated circuit comprising a memory core of a plurality of cells and accessible at a first speed; and
   an interface integrated circuit electrically coupled to the plurality of DRAM integrated circuits for providing an interface between the DRAM integrated circuits and the memory bus at a speed greater than the first speed;
   wherein the plurality of DRAM integrated circuits includes:
      at least one DRAM integrated circuit which was incorporated into the memory device at manufacturing time; and
      at least one DRAM integrated circuit which was incorporated into the memory device at a later time.

21. A memory device for electrical connection to a memory bus, the memory device comprising:
   a plurality of dynamic random access memory ("DRAM") integrated circuits, stacked in a vertical direction, each DRAM integrated circuit comprising a memory core of a plurality of cells and accessible at a first speed;
   an interface integrated circuit electrically coupled to the plurality of DRAM integrated circuits for providing an interface between the DRAM integrated circuits and the memory bus at a speed greater than the first speed;
   a printed circuit board; and
   a socket for mounting the plurality of DRAM integrated circuits in a rank to the printed circuit board.

22. A memory device for use with a memory bus, the memory bus comprising:
   a plurality of dynamic random access memory ("DRAM") integrated circuits, stacked in a vertical direction, each comprising a memory core of a plurality of cells accessible at low speed; and
   an interface integrated circuit for providing an interface, at a high speed relative to the low speed, between the DRAM integrated circuits and the memory bus;
   wherein the interface integrated circuit is adapted for providing a predetermined electrical load on the memory bus independent of a number of the DRAM integrated circuits to which the interface integrated circuit is electrically coupled.

23. A memory device for use with a memory bus, the memory bus comprising:
   means for stacking, in a vertical direction, a plurality of dynamic random access memory ("DRAM") integrated circuits each comprising a memory core of a plurality of cells accessible at a first speed; and
   means for providing an interface between the DRAM integrated circuits and the memory bus at a speed greater than the first speed;
   wherein the means for providing the interface is adapted for providing a predetermined electrical load on the memory bus independent of a number of the DRAM integrated circuits to which the means for providing the interface is electrically coupled.

* * * * *